United States Patent

Koyanagi et al.

[11] Patent Number: 5,880,624
[45] Date of Patent: Mar. 9, 1999

[54] CONSTANT POTENTIAL GENERATING CIRCUIT AND SEMICONDUCTOR DEVICE USING SAME

[75] Inventors: Masaru Koyanagi; Kazuhiro Hataoka, both of Kanagawa-ken, Japan

[73] Assignee: Kabushiki Kaisha Toshiba, Tokyo, Japan

[21] Appl. No.: 499,514

[22] Filed: Jul. 7, 1995

[30] Foreign Application Priority Data

Jul. 8, 1994 [JP] Japan ................................. 6-157402

[51] Int. Cl.⁶ ...................................................... H03K 17/16
[52] U.S. Cl. ........................... 327/541; 327/538; 327/543; 323/313; 323/315; 323/316; 323/317
[58] Field of Search ................................. 326/21, 26, 27, 326/31, 34, 82, 83, 87, 89, 91; 327/108, 112, 379, 384, 389, 391, 77, 87, 89, 538, 540, 543, 541; 323/313, 315, 316, 317

[56] References Cited

U.S. PATENT DOCUMENTS

| 4,829,199 | 5/1989 | Prater ........................................ 307/443 |
| 4,959,561 | 9/1990 | McDermott et al. .................... 307/443 |
| 4,961,010 | 10/1990 | Davis ........................................ 307/443 |
| 5,159,516 | 10/1992 | Fujihira ...................................... 361/18 |
| 5,319,258 | 6/1994 | Ruetz ........................................ 307/443 |
| 5,361,003 | 11/1994 | Roberts ...................................... 326/21 |
| 5,396,117 | 3/1995 | Housen et al. ........................... 327/480 |

FOREIGN PATENT DOCUMENTS

000509489 A1 10/1992 European Pat. Off. ................... 326/27
000533340 A2 3/1993 European Pat. Off. ................... 326/26

Primary Examiner—Timothy P. Callahan
Assistant Examiner—An T. Luu
Attorney, Agent, or Firm—Loeb & Loeb LLP

[57] ABSTRACT

When an intermediate potential is required inside a semiconductor device, the constant potential generating circuit can output a stable potential, while maintaining a high driving capability, so that the controllability of the semiconductor device can be improved. The constant potential generating circuit comprises a first output circuit composed of two transistors P16 and N16 for supplying an intermediate output potential $V_{out}$ to a load; a second output circuit composed of two transistors P11 and N11 for outputting a voltage corresponding to the output potential $V_{out}$ to a node 13; a resistor R11 interposed between an output point of the output potential $V_{out}$ and the node 13; and a differential amplifier circuit Ad for comparing the voltage at the node 13 with the reference potential $V_{ref}$ to apply control signals to the transistors P11, N11, P16 and N16, respectively. In response to the control signals applied from the differential amplifier circuit Ad, the response speed of the second circuit composed of the transistors P11 and N11 is determined higher than that of the first circuit composed of the transistors P16 and N16. Therefore, when the output potential $V_{out}$ changes relative to the reference potential $V_{ref}$, the gate control signals are outputted from the differential amplifier circuit Ad, by comparing the voltage at the node 13 (at which the response speed is high in response to the control signals) with the reference potential $V_{ref}$, so that the output potential $V_{out}$ can be controlled at a stable point at high speed. [FIG. 1]

21 Claims, 23 Drawing Sheets

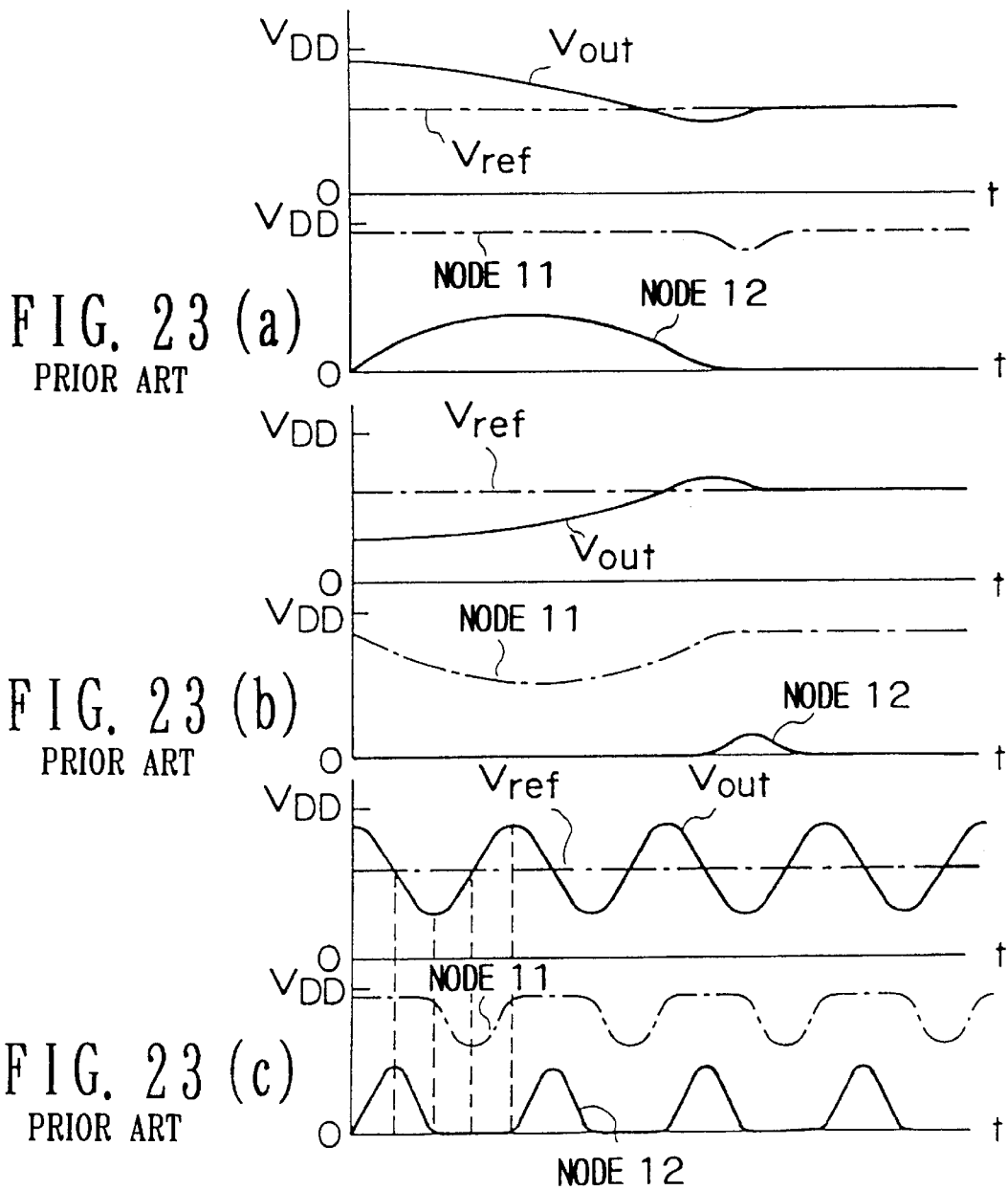
FIG. 23 (a) PRIOR ART
FIG. 23 (b) PRIOR ART
FIG. 23 (c) PRIOR ART

CONSTANT POTENTIAL GENERATING CIRCUIT AND SEMICONDUCTOR DEVICE USING SAME

BACKGROUND OF THE INVENTION

1. Field of the Invention

The present invention relates to a constant potential generating circuit and a semiconductor device using the same constant potential generating circuit, and more specifically to a constant potential generating circuit which can increase drive capability and is suitable for control stability, in particular when an intermediate potential is generated, and a semiconductor device using the same constant potential generating circuit.

2. Description of the Prior Art

FIG. 22 is a circuit diagram showing a prior art constant potential generating circuit device which can increase the capability of outputting any required intermediate potential. In the drawing, a series circuit of a P-channel transistor P11 and an N-channel transistor N11 is connected between a supply potential $V_{DD}$ and a ground potential $V_{SS}$, and any determined intermediate output potential $V_{out}$ can be outputted from a junction point between the two drains of the transistor P11 and the transistor N11. The output potential $V_{out}$ is supplied to a load which requires an intermediate potential. On the other hand, a predetermined intermediate reference potential $V_{ref}$ and the output potential $V_{out}$ of this circuit are both given to a differential amplifier circuit Ad, and two control voltages are outputted from the differential amplifier circuit Ad to a node 11 and another node 12, respectively. Further, the control voltage at the node 11 is given to the gate of the transistor P11, and the control voltage at the node 12 is given to the gate of the transistor N11.

The operation of the circuit constructed as described above will be described hereinbelow with reference to some waveform diagrams shown in FIGS. 23(a) to 23(c), in which FIG. 23(a) shows the operation obtained when the output potential $V_{out}$ is higher than the reference potential $V_{ref}$; FIG. 23(b) shows the operation obtained when the output potential $V_{out}$ is lower than the reference potential $V_{ref}$; and FIG. 23(c) shows the operation obtained when the output potential $V_{out}$ is oscillated on the basis of the reference potential $V_{ref}$.

Now, when the output potential $V_{out}$ is roughly the same in level as the reference potential $V_{ref}$; that is, when the circuit is at a stable point, the potential at the node 11 is at roughly the supply potential $V_{DD}$ and the potential at the node 12 is at roughly the ground potential $V_{SS}$, so that both the transistors P11 and N11 are turned off.

Here, the differential amplifier circuit Ad compares the output potential $V_{out}$ with the reference potential $V_{ref}$, and controls the gate voltages of the transistor P11 and the transistor N11 in such a way that the output potential $V_{out}$ becomes equal to the reference potential $V_{ref}$.

Now, when the output potential $V_{out}$ is higher than the reference potential $V_{ref}$ as shown in FIG. 23(a), the differential amplifier circuit Ad detects the difference between the two and operates so that the node 12 can be pulled up from a low level. As a result, the transistor N11 is turned on to pull down the level of the output potential $V_{out}$.

Consequently, when the output potential level $V_{out}$ reaches the reference potential level $V_{ref}$, the differential amplifier circuit Ad pulls down the node 12 to a low level, with the result that the output potential $V_{out}$ approaches the reference potential $V_{ref}$, and thereby a stable point can be obtained.

Further, when being lowered, if the output potential $V_{out}$ is dropped excessively below the reference potential $V_{ref}$, the differential amplifier circuit Ad operates for correction by pulling down the node 11 from the supply potential $V_{DD}$, so that the output potential $V_{out}$ can be returned up to the reference potential $V_{ref}$.

In contrast with this, when the output potential $V_{out}$ is lower than the reference potential $V_{ref}$ as shown in FIG. 23(b), the differential amplifier circuit Ad detects the difference between the two and operates so that the node 11 can be pulled down from a high level. As a result, the transistor P11 is turned on to pull up the level of the output potential $V_{out}$.

Consequently, when the output potential level $V_{out}$ reaches the reference potential level $V_{ref}$, the differential amplifier circuit Ad pulls up the node 11 to a high level, with the result that the output potential $V_{out}$ approaches the reference potential $V_{ref}$, and thereby a stable point can be obtained.

Further, when being raised, if the output potential $V_{out}$ rises excessively beyond the reference potential $V_{ref}$, the differential amplifier circuit Ad operates for correction by pulling up the node 12 from the ground potential $V_{SS}$, so that the output potential $V_{out}$ can be returned down to the reference potential $V_{ref}$.

In the prior art semiconductor device as described above, however, there exists a problem as follows: In the circuit construction as shown in FIG. 22, when the capability of both the transistors P11 and N11 for deciding the output potential $V_{out}$ is increased, the level change speed of the output potential $V_{out}$ increases. When the level change speed increases, there exists a possibility such that since the differential amplifier circuit Ad detects the difference between the reference potential $V_{ref}$ and the output potential $V_{out}$, the level change speed at the output potential $V_{out}$ increases higher than the level control speed at the node 11 or 12. The situation as described above occurs more prominently with increasing driving capability of the transistors P11 and N11 (in order to increase the driving capability of the output potential $V_{out}$ outputted as an intermediate level). As a result, before converging to the reference potential $V_{ref}$, the output potential $V_{out}$ overshoots or undershoots, with the result that the stabilization of the output potential $V_{out}$ at the reference potential $V_{ref}$ is delayed. When this situation becomes extremely, the output potential $V_{out}$ overshoots and undershoots repeatedly, as shown in FIG. 23(c), and thereby the control voltages at the nodes 11 and 12 both oscillate, with the result that it is impossible to stabilize the level of the output potential $V_{out}$.

To overcome this problem, it is necessary to reduce the change speed of the output potential $V_{out}$ sufficiently slower than the level detection speed of the differential amplifier circuit Ad. For this purpose, it is necessary to lower the driving capability of the transistors P11 and N11 or to change the response speed to the level change of the output potential $V_{out}$ with respect to time, according to the level difference between the output potential $V_{out}$ and the reference potential $V_{ref}$. However, when the driving capability of the output transistors is lowered, the original object of increasing the driving capability of the intermediate potential cannot be achieved. On the other hand, when the circuit response characteristics are changed according to the level change or with the elapse of time, it is difficult to set the circuit constants, so that the circuit may be operated erroneously, thus resulting in various undesired problems.

SUMMARY OF THE INVENTION

With these problems in mind, therefore, it is the object of the present invention to provide a constant potential generating circuit which can easily output a stabilized output, while keeping the driving capability of an intermediate potential.

To achieve the above-mentioned object, the present invention provides a constant potential generating circuit, comprising: a first output circuit for outputting an output voltage corresponding to an inputted control signal level, from a first output terminal; a second output circuit for outputting a comparison voltage corresponding to the inputted control signal level, from a second output terminal at a response speed higher than that of said first output circuit; a connecting circuit connected between the first output terminal and the second output terminal; and a comparing circuit for comparing the comparison voltage with a reference voltage, outputting the control signal on the basis of the comparison result, controlling the comparison voltage on the basis of the control signal, and further controlling the output voltage by comparing the controlled comparison voltage with the reference voltage.

Since the response speed of second output circuit (differential side) is determined higher than that of the first output circuit (output side), both in response to the control signals outputted from the comparing circuit, when the output voltage $V_{out}$ of the first output terminal changes relative to the reference voltage $V_{ref}$, the output voltage of the first output circuit can be controlled to a stable point at a high speed by comparing the voltage at the second output terminal (high response speed) with the reference voltage.

BRIEF DESCRIPTION OF THE DRAWINGS

FIGS. 23(a) to 23(c) are waveform diagrams for assistance in explaining the operation of the circuit shown in FIG. 22.

DETAILED DESCRIPTION OF THE PREFERRED EMBODIMENTS

The embodiments of the present invention will be described hereinbelow with reference to the attached drawings.

(First Embodiment)

Figure 1:
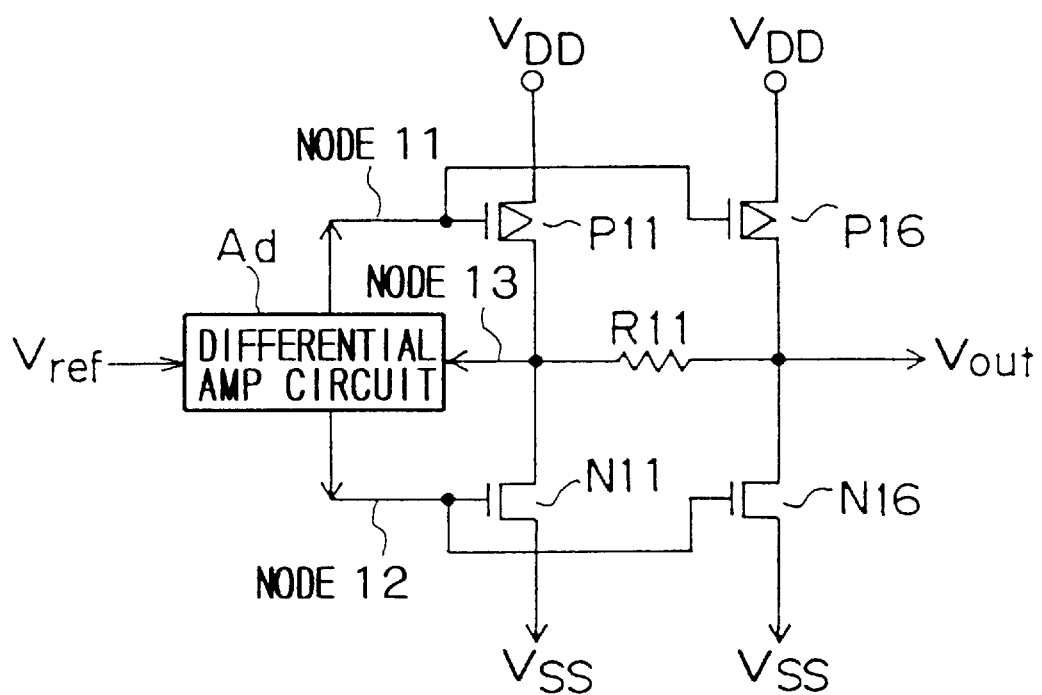
FIG. 1 is a circuit diagram showing a first embodiment of the constant potential generating circuit device according to the present invention.

FIG. 1 is a circuit diagram showing a first embodiment of the constant potential generating circuit (intermediate potential generating circuit) according to the present invention. In FIG. 1, an output potential $V_{out}$ is outputted from a junction point between two drains of a P-channel transistor P16 (whose source is connected to a supply potential $V_{DD}$) and an N-channel transistor N16 (whose source is connected to a supply potential $V_{SS}$). A node 11 is connected to the gate of the transistor P16, and a node 12 is connected to the gate of the transistor N16. Further, a junction point between two drains of the of a P-channel transistor P11 (whose source is connected to the supply potential $V_{DD}$) and an N-channel transistor N11 (whose source is connected to the supply potential $V_{SS}$) is connected to a node 13. The gate of the transistor P11 is connected to the node 11 and the gate of the transistor N11 is connected to the node 12, respectively. A resistor R11 is connected between the node 13 and the output potential $V_{out}$. Further, a reference potential $V_{ref}$ and the potential at the node 13 are given to a differential amplifier circuit Ad.

Figure 2:
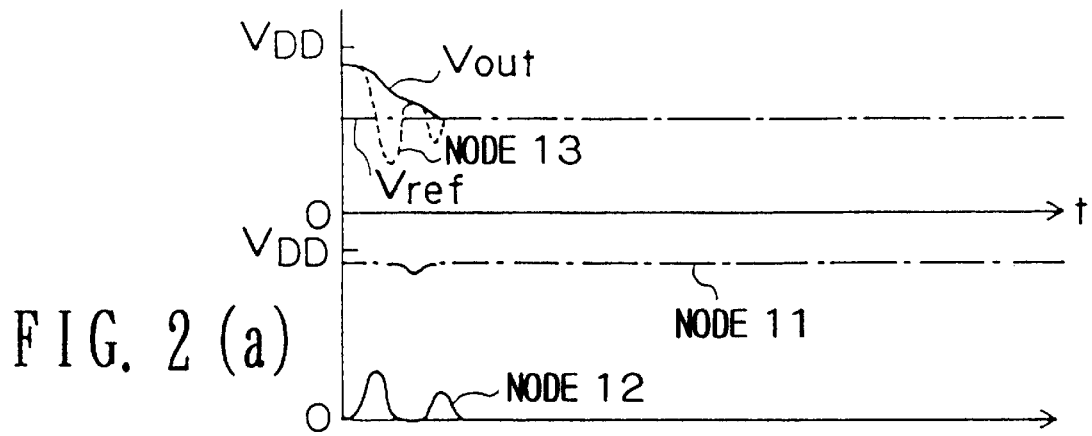
FIGS. 2(a) and 2(b) are waveform diagrams for assistance in explaining the operation of the circuit device shown in FIG. 1.
Figure 2:
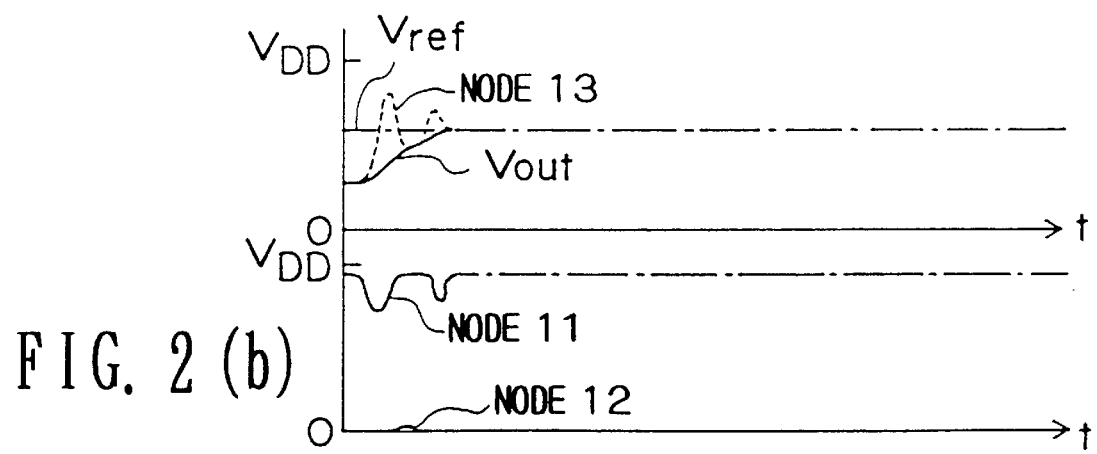

The operation of the circuit constructed as shown in FIG. 1 will be explained with reference to the waveform diagram shown in FIGS. 2(a) and 2(b), in which FIG. 2(a) shows the case where the output potential $V_{out}$ is higher than the reference potential $V_{ref}$, and FIG. 2(b) shows the case where the output potential $V_{out}$ is lower than the reference potential $V_{ref}$.

The resistor R11 is connected between a junction point (between a complementary pair of two transistors P16 and N16) and another junction point (between a complementary pair of two transistors P11 and N11). The transistors P11 and P16 are controlled at the common node 11, and the transistors N11 and N16 are controlled at the common node 12. Therefore, it is possible to set the response speed at the node 13 to be higher than that of the output potential $V_{out}$ in response to the level change at the nodes 11 and 12. In this example, although the driving capability of the transistors P16 and N16 is about twice higher than that of the transistors P11 and N11, since the parasitic capacitance at the output terminal of the output potential $V_{ref}$ is about 1000 times larger than that at the node 13, the response speed at the node 13 is higher than that at the output terminal.

Further, in the case of a load which requires an intermediate potential, a large part of power is supplied through a complementary pair of the two transistors P16 and N16. In practice, however, a small part of power is also supplied through a complementary pair of the two transistors P11 and N11 and the resistor R11.

In this embodiment, the respective driving capabilities of the respective transistors P11, N11 and P16, N16 and the resistance of the resistor R11 are determined in such a way as to satisfy the above-mentioned conditions.

The actual numerical values can be given as follows: W/L (channel width/channel length) of the MOS transistor P11 is 20/1.1 (unit: $\mu$m, the same, hereinafter); W/L of N11 is 10/1.1; W/L of P16 is 54/1.1; W/L of N16 is 27/1.1; and the resistance of R11 is about 10 k$\Omega$. When the channel width is kept constant, since the driving capability of the N-channel MOS transistor is larger than that of the P-channel transistor, the above-mentioned setting is appropriate.

The operation of the circuit shown in FIG. 1 can be optimized when the following conditions are satisfied:

Conductance of P11<Conductance of P16
Conductance of N11<Conductance of N16
Capacitance at Node 13<Capacitance at $V_{out}$ The operation of the circuit shown in FIG. 1 will be explained in detail.

When the output potential $V_{out}$ is stable, the output potential $V_{out}$ and the potential at the node 13 are equal to each other. That is, when the output potential $V_{out}$ is stabilized at a stable point and therefore roughly equal to the same level as the reference potential $V_{ref}$, the node 11 is at roughly the supply potential $V_{DD}$ level, and the node 12 is at roughly the ground potential $V_{SS}$ level. As a result, the transistors P11, N11, P16 and N16 are all roughly turned off.

Under the conditions as described above, the differential amplifier circuit Ad compares the potential at the node 13 with the reference potential $V_{ref}$.

Now, the assumption is made that the output potential $V_{out}$ increases higher than the reference potential $V_{ref}$, so that the level at the node 13 is higher than the reference potential $V_{ref}$. In this case, the differential amplifier circuit Ad detects this difference and pulls up the node 12 from the low level to control the gates of the two transistors N11 and N16, that is, to turn on these two transistors. As a result, the output potential $V_{out}$ is pulled down toward the reference potential $V_{ref}$, so that the output potential $V_{out}$ is controlled so as to become equal to the reference potential $V_{ref}$. In this case, however, since the voltage at the node 13 changes more speedy than the output potential $V_{out}$, the voltage at the node 13 reaches the reference potential $V_{ref}$ before the output potential $V_{out}$ reaches the reference potential $V_{ref}$. As a result, the output potential $V_{out}$ undershoots below the reference potential $V_{ref}$, so that it is possible to prevent the occurrence of oscillation.

Further, before the output potential $V_{out}$ reaches the reference potential $V_{ref}$, in case the voltage at the node 13 undershoots below the reference potential $V_{ref}$, as shown in FIG. 2(a), the differential amplifier circuit Ad detects this voltage and sets the node 12 to a low level and pulls down the node 11 below the high level. As a result, although the gates of the two transistors P11 and P16 are both controlled so as to be turned on, since the node 13 can be returned to near the output potential $V_{out}$ at high response speed through the resistor R11, the differential amplifier circuit Ad returns the node 11 to the high level, and further pulls up the node 12 again from the low level. As a result, the transistors N11 and N16 are both turned on again, so that the output potential $V_{out}$ decreases down to the reference potential $V_{ref}$.

By repeating the above-mentioned operation, it is possible to control the output potential $V_{out}$ at the reference potential $V_{ref}$ stably. Further, when the output potential $V_{out}$ is stabilized at the reference potential $V_{ref}$, the node 11 returns to the high level and the node 12 returns to the low level, so that the transistors N11, P11, N16 and P16 are all turned off under a stable condition.

In contrast with this, when the output potential $V_{out}$ decreases below the reference potential $V_{ref}$ and thereby the level at the node 13 drops below the reference potential $V_{ref}$, the differential amplifier circuit Ad detects this to pull down the node 11 from the high level, and controls the gates of these transistors P11 and P16 to turn on these transistors. As a result, the output potential $V_{out}$ is pulled up to the reference potential $V_{ref}$, so that the output potential $V_{out}$ can be controlled at the reference potential $V_{ref}$. In this case, however, since the voltage at the node 13 changes more speedy than the output potential $V_{out}$, the voltage at the node 13 reaches the reference potential $V_{ref}$ before the output potential $V_{out}$ reaches the reference potential $V_{ref}$. As a result, the output potential $V_{out}$ overshoots beyond the reference potential $V_{ref}$, so that it is possible to prevent the occurrence of oscillation.

Further, before the output potential $V_{out}$ reaches the reference potential $V_{ref}$, in case the voltage at the node 13 overshoots beyond the reference potential $V_{ref}$, as shown in FIG. 2(b), the differential amplifier circuit Ad detects this voltage and sets the node 11 to a high level and pulls up the node 12 below the high level. As a result, although the gates of the two transistors N11 and N16 are both controlled so as to be turned on, since the node 13 can be returned to the output potential $V_{out}$ at high response speed through the resistor R11, the differential amplifier circuit Ad returns the node 12 to the low level, and further pulls down the node 11 again from the high level. As a result, the transistors P11 and P16 are both turned on again, so that the output potential $V_{out}$ increases up to the reference potential $V_{ref}$.

By repeating the above-mentioned operation, it is possible to control the output potential $V_{out}$ at the reference potential $V_{ref}$ stably. Further, when the output potential $V_{out}$ is stabilized at the reference potential $V_{ref}$, the node 11 returns to the high level and the node 12 returns to the low level, so that the transistors N11, N16, P11 and P16 are all turned off under a stable condition.

Figure 3:
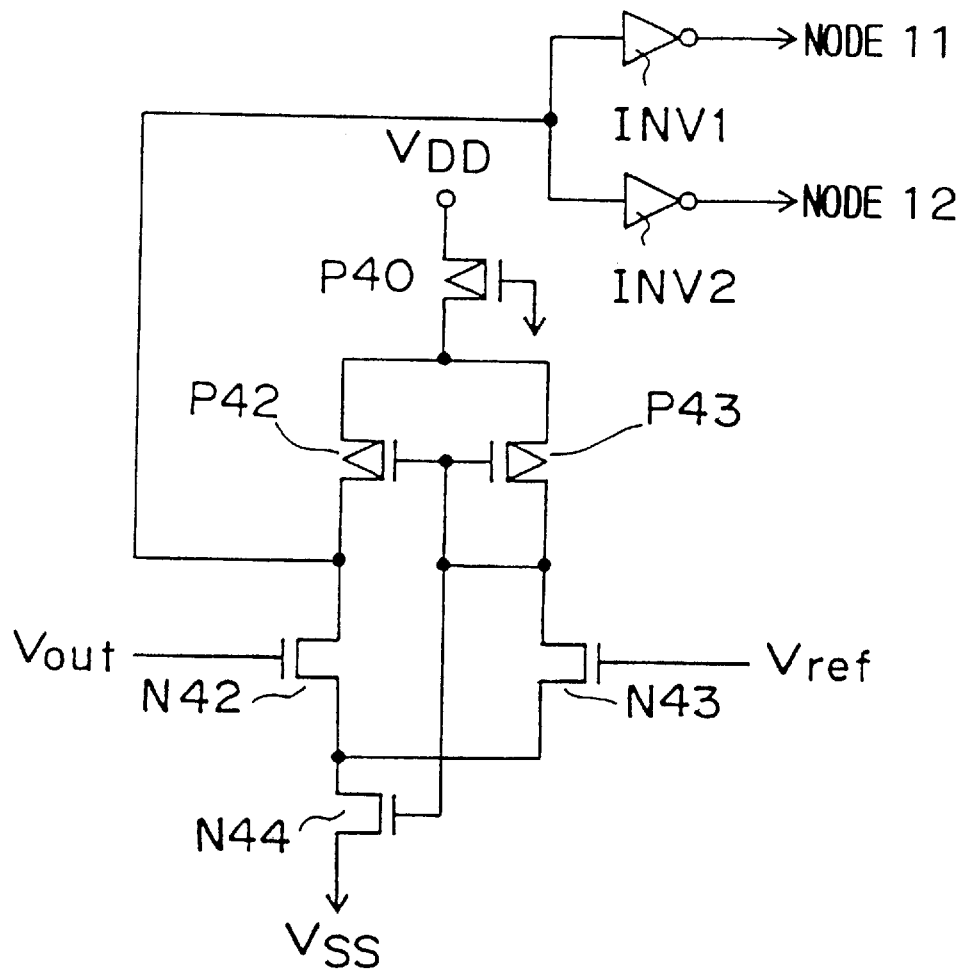
FIG. 3 is a circuit diagram showing a first example of the differential amplifier circuit.
Figure 4:
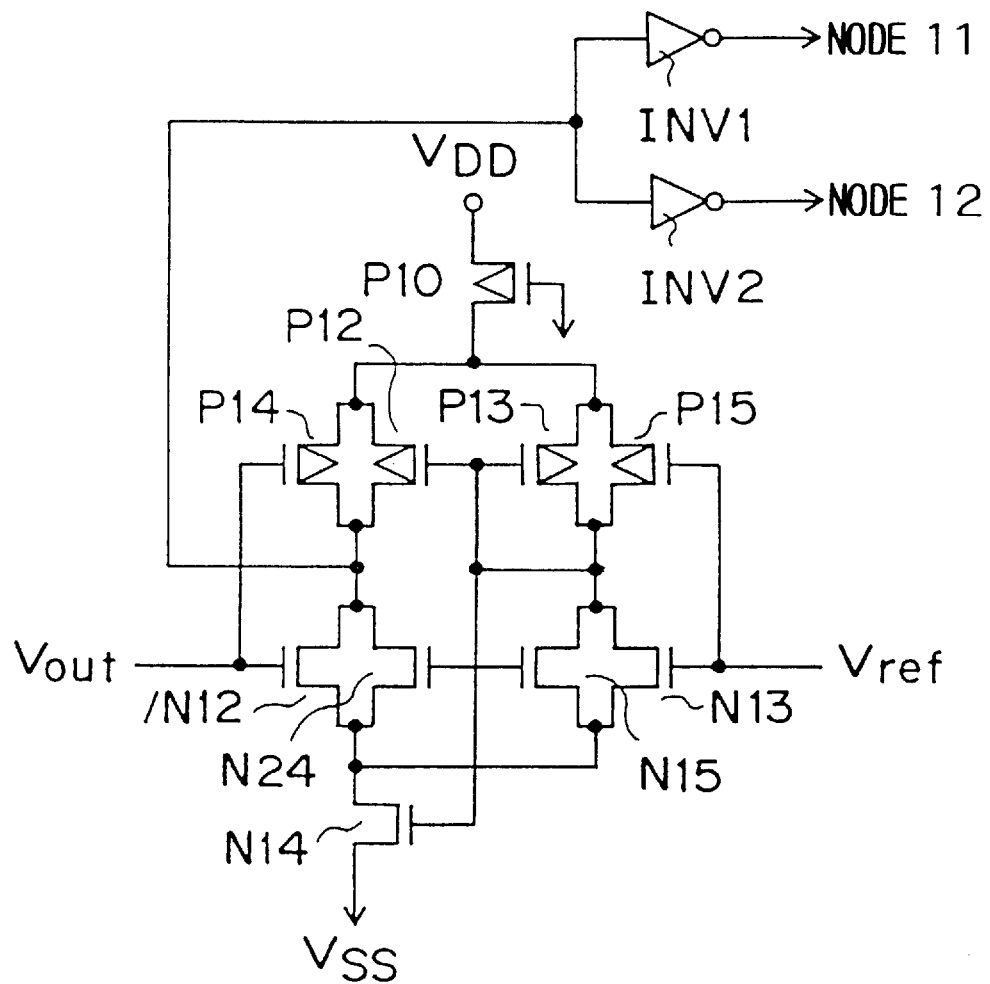
FIG. 4 is a circuit diagram showing a second example of the differential amplifier circuit.

In this connection, the differential amplifier circuit Ad shown in FIG. 1 can be constructed as shown in FIG. 3 or FIG. 4.

FIG. 3 is a circuit diagram showing a first example of the differential amplifier circuit Ad shown in FIG. 1. In FIG. 3, the reference potential $V_{ref}$ is inputted to the gate of an N-channel transistor N43 and the output potential $V_{out}$ is inputted to the gate of an N-channel transistor N42, respectively. The drain of the transistor N42 is connected to the drain of a P-channel transistor P42, and the drain of the transistor N43 is connected to the drain of a P-channel transistor P43. Further, the sources of the transistors N42 and N43 are connected to the drain of an N-channel transistor 44 whose source is connected to a ground potential $V_{SS}$. The three gates of the transistor N44 and the transistors P42 and P43 are connected to a junction point of the drains of the two transistors N43 and P43. On the other hand, the two sources of the transistors P42 and P43 are connected to the drain of a P-channel transistor P40. The source of the transistor P40 is connected to a supply potential $V_{DD}$ and the gate thereof is connected to a ground potential $V_{SS}$, respectively. A junction point of the drains of the two transistors P42 and N42 is connected to two inverters INV1 and INV2. The output of the inverter INV1 is connected to the node 11, and the output of the inverter INV2 is connected to the node 12, respectively.

Further, FIG. 4 is a circuit diagram showing a second example of the differential amplifier circuit, which is different from that shown in FIG. 3 in that two N-channel transistors N12 and N24 are connected in parallel to each other; two N-channel transistors N13 and N15 are connected in parallel to each other; and two P-channel transistors P12 and P14 are connected in parallel to each other; and two P-channel transistors P13 and P15 are connected in parallel to each other. Further, in FIG. 4, the three gates of the three transistors N12, N14 and P13 are connected to the two drains of the two transistors N12 and P13. The gate of the transistor P14 is connected to the output potential $V_{out}$, and the gate of the transistor P15 is connected to the reference potential $V_{ref}$, respectively. The circuit construction shown in FIG. 4 can operate also at a speed higher than that shown in FIG. 3 and further the operating ranges of $V_{ref}$ and $V_{out}$ can be both broadened, so that the circuit shown in FIG. 4 is more preferable for the present invention.

Further, the circuit constructions shown in both FIGS. 3 and 4 are of well-known current mirror circuit type, in which the levels at the two nodes 11 and 12 can be controlled at an appropriate level, according to the level difference between the output potential $V_{out}$ and the reference potential $V_{ref}$.

Further, since the P-channel transistor and the N-channel transistor for constituting INV1 and INV2 can be set separately or independently, it is possible to determine the threshold values of the INV1 and INV2, independently. For example, the threshold value of the inverter $INV_1$ is 3 volts, and that of the inverter $INV_2$ is 2 volts, which causes a 1 volt of non-sensitive range (the P ch and the N ch transistors are non-conductive). Generally, it is preferable that the threshold values satisfy the following equation:

$$V_{th}(INV_1) > V_{th}(INV_2)$$

Accordingly, since a non-sensitive range to the intermediate potential can be provided, the output circuit can be controlled more stably.

(Second Embodiment)

Figure 5:
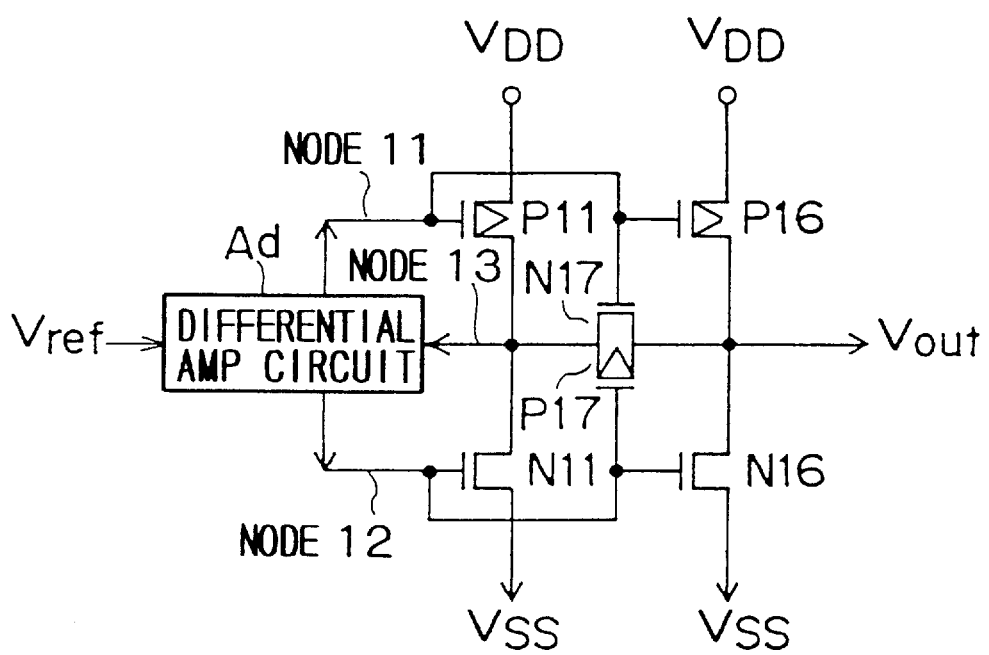
FIG. 5 is a circuit diagram showing a second embodiment of the constant potential generating circuit device according to the present invention.
Figure 11:
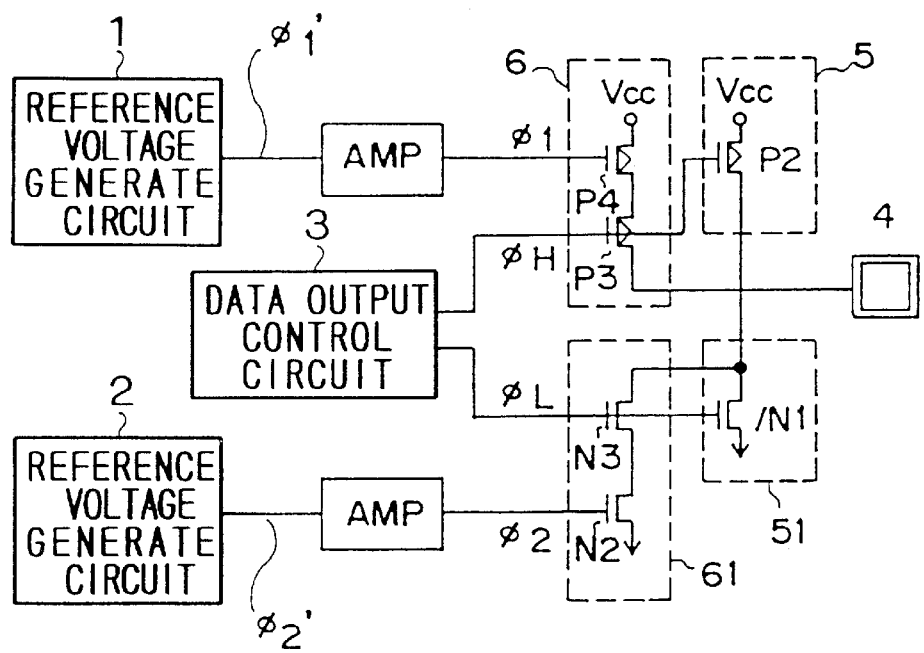
FIG. 11(a) is a circuit diagrams showing a first modification of the first application example of the present invention.
FIG. 11(b) is a circuit diagram showing the reference voltage generating circuit shown in FIG. 11(a)
Figure 11:
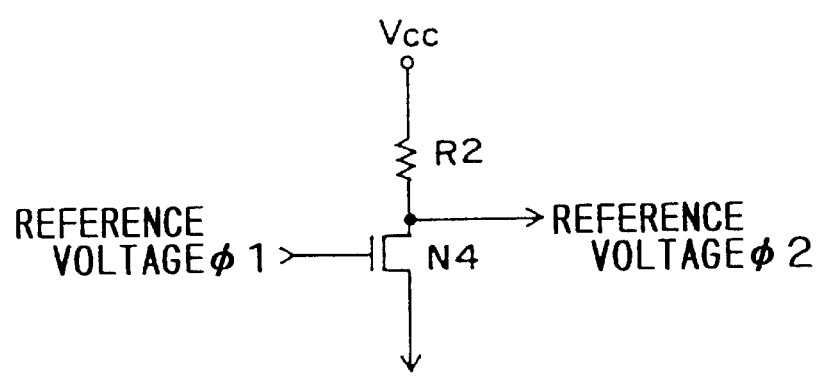

FIG. 5 is a circuit diagram showing a second embodiment of the intermediate potential generating circuit device according to the present invention. The circuit construction shown in FIG. 5 is different from that shown in FIG. 1 in that a transfer circuit composed of a P-channel transistor P17 and an N-channel transistor N17 is provided, instead of the resistor R11 shown in FIG. 11. In other words, the transfer circuit functions as a variable resistance circuit, instead of the resistor R11 shown in FIG. 1. The transfer circuit controls the levels at the nodes 11 and 12, respectively.

The operation of the circuit shown in FIG. 5 will be explained hereinbelow in detail.

The assumption is made that the output potential $V_{out}$ is at a stable point, so that the output potential $V_{out}$ is roughly equal to the reference potential $V_{ref}$. In this case, the node 11 is at roughly the supply potential $V_{DD}$ level, and the node 12 is at roughly the ground potential $V_{SS}$ level. As a result, the transistors P17 and N17 are both turned on, so that the output potential $V_{out}$ is the same level as the potential at the node 13. On the other hand, the transistors P11, N11, P16 and N16 are almost turned off. Under these conditions, the differential amplifier Ad compares the potential at the node 13 with the reference potential $V_{ref}$.

Now, the assumption is made that the output potential $V_{out}$ increases higher than the reference potential $V_{ref}$, so that the level at the node 13 is higher than the reference potential $V_{ref}$. In this case, the differential amplifier circuit Ad detects this difference and pulls up the node 12 from the low level to control the gates of the two transistors N11 and N16, that is, to turn on these two transistors. As a result, the output potential $V_{out}$ is pulled down to the reference potential $V_{ref}$, so that the output potential $V_{out}$ is controlled so as to become equal to the reference potential $V_{ref}$. On the other hand, however, since the transistor P17 is turned off or becomes a high resistance status, the voltage change speed at the node 13 is higher than that of the output potential $V_{out}$. In other words, since the voltage at the node 13 changes more speedy than the output potential $V_{out}$, the voltage at the node 13 reaches the reference potential $V_{ref}$ before the output potential $V_{out}$ reaches the reference potential $V_{ref}$. As a result, the output potential $V_{out}$ changes abruptly relative to the reference potential $V_{ref}$; that is, the output potential $V_{out}$ undershoots below the reference potential $V_{ref}$, so that it is possible to prevent the occurrence of oscillation.

Further, before the output potential $V_{out}$ reaches the reference potential $V_{ref}$, in case the voltage at the node 13 undershoots below the reference potential $V_{ref}$, since the level at the node 13 can be returned to the output potential $V_{out}$ quickly by the transistors P17 and N17, it is possible to prevent an erroneous operation of the differential amplifier circuit Ad, in the same way as with the case of the circuit shown in FIG. 1.

In contrast with this, when the output potential $V_{out}$ decreased below the reference potential $V_{ref}$ and thereby the level at the node 13 drops below the reference potential $V_{ref}$, the differential amplifier circuit Ad detects this to pull down the node 11 from the high level, and controls the gates of these transistors P11 and P16 to turn on these transistors. As a result, the output potential $V_{out}$ is pulled up to the reference potential $V_{ref}$, so that the output potential $V_{out}$ can be controlled at the reference potential $V_{ref}$. On the other hand, however, since the transistor P17 is turned off or becomes a high resistance status, the voltage change speed at the node 13 is higher than that of the output potential $V_{out}$. In other words, since the voltage at the node 13 changes more speedy than the output potential $V_{out}$, the voltage at the node 13 reaches the reference potential $V_{ref}$ before the output potential $V_{out}$ reaches the reference potential $V_{ref}$. As a result, the output potential $V_{out}$ changes abruptly relative to the reference potential $V_{ref}$; that is, the output potential $V_{out}$ overshoots beyond the reference potential $V_{ref}$, so that it is possible to prevent the occurrence of oscillation.

Further, before the output potential $V_{out}$ reaches the reference potential $V_{ref}$, in case the voltage at the node 13 overshoots beyond the reference potential $V_{ref}$, since the level at the node 13 can be returned to the output potential $V_{out}$ quickly by the transistors P17 and N17, it is possible to prevent an erroneous operation of the differential amplifier circuit Ad, in the same way as with the case of the circuit shown in FIG. 1.

As described above, in the second embodiment, the resistance value between the node 13 and the output potential $V_{out}$ can be changed dynamically by the two transistors N17 and P17 intervening between the two. Therefore, since the response speed at the node 13 can be increased as compared with the change of the output potential $V_{out}$, the response speed of the differential amplifier circuit can be increased, with the result that it is possible to stabilize the output potential $V_{out}$.

Further, it is possible to expect the similar effect by inserting a resistance element in parallel to the transfer circuit composed of the two transistors N17 and P17 (although there exists some difference between the two). In this case, the resistance value of the inserted resistance element is determined at an optimize value on the basis the correlation between the turn-on and -off resistances of the transistors N11, P11, N16, P16, N17 and P17.

Further, the potentials applied to the gates of the two transistors N17 and P17 are not necessarily the potentials existing at the nodes 11 and 12, and any signals can be used therefor, as far as the signals can control the functions of the two transistors N17 and P17.

(Third Embodiment)

Figure 6:
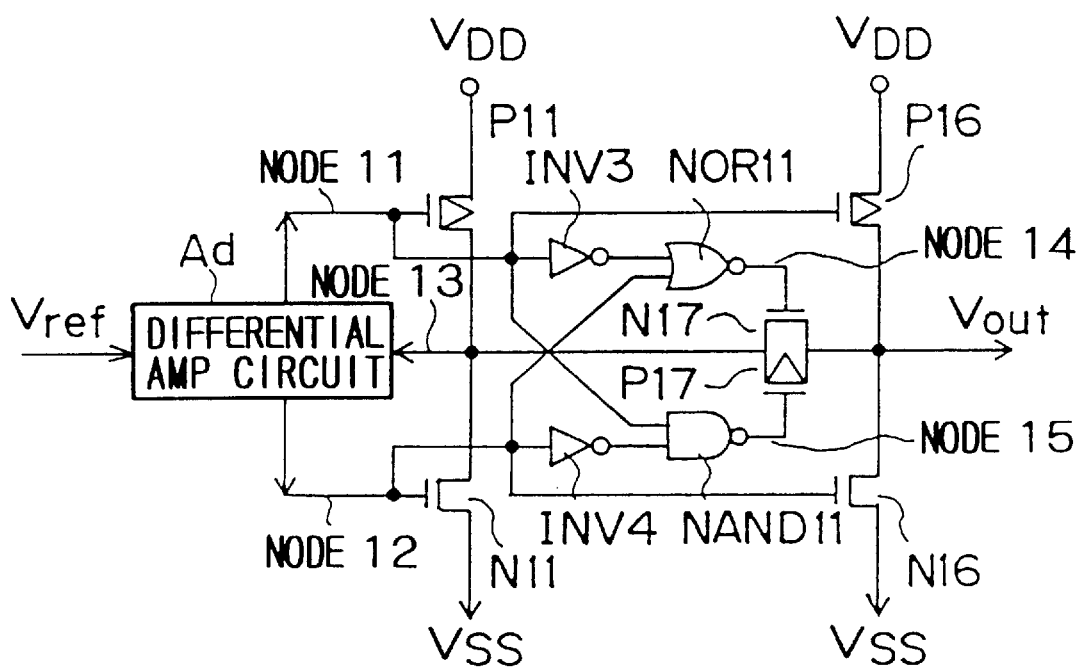
FIG. 6 is a circuit diagram showing a third embodiment of the constant potential generating circuit device according to the present invention.

FIG. 6 is a circuit diagram showing a third embodiment of the intermediate potential generating circuit device according to the present invention. The circuit shown in FIG. 6 is different from that shown in FIG. 5 in that signals at nodes 14 and 15 are used to control the gates of the two transistors N17 and P17 shown in FIG. 5. An output of a NOR circuit NOR11 is outputted to the node 14, and an output of a NAND circuit NAND11 is outputted to the node 15. Further, a node 11 is connected to an inverter INV3 and the NAND circuit NAND11, and a node 12 is connected to the NOR circuit NOR11 and an inverter INV4. Further, the output of the inverter INV3 is given to the NOR circuit NOR11, and the output of the inverter INV4 is given to the NAND circuit NAND11.

The operation of the circuit constructed as shown in FIG. 6 will be described hereinbelow.

The node 14 of the gate of the transistor N17 corresponds to the output of the NOR11. The inputs of the NOR11 are an output of the inverter INV3 (whose input is the node 11) and the node 12. Here, the inverter INV3 functions to convert the level of the node 11. That is, when the level at the node 12 changes to a high level, the NOR circuit NOR11 sets the node 14 to a low level to allow the transistor N17 to be easily turned off. On the other hand, the node 15 of the gate of the transistor P17 corresponds to the output of the NAND circuit 11. The inputs of the NAND11 are an output of the inverter INV3 (whose input is the node 12) and the node 11. Here, the inverter INV4 functions to convert the level of the node 12. That is, when the level at the node 11 changes to a low level, the NAND circuit NAND11 sets the node 15 to a high level to allow the transistor P17 to be easily turned off. Since a logic circuit is additionally provided as described above, when the transistors P11, N11, P16 and N16 are turned on, the resistance between the output potential $V_{out}$ and the node 13 can be increased. Therefore, it is possible to further increase the voltage transition speed at the node 13, as compared with that of the output potential $V_{out}$. As a result, the response speed of the differential amplifier circuit Ad can be further increased.

Further, in the third embodiment, it is possible to construct the circuit so as to correspond to various objects, by appropriately combining resistance elements.

Further, in the above-mentioned first, second and third embodiments, the transistors for charging and discharging the output potential $V_{out}$ and the node 13 of the differential amplifier circuit Ad are not necessarily of conductive type, as shown in the drawings. Further, when the conductive types of these transistors are changed, the same effect can be obtained by changing the phases and the levels at the respective nodes 11 and 12 of the differential amplifier circuit appropriately.

Further, the differential amplifier circuit Ad shown in FIGS. 5 and 6 can be constructed in the same way as with the case as shown in FIG. 3 or FIG. 4.

As described above, in the embodiments of the constant potential generating circuit according to the present invention, since the intermediate potential generating circuit device according to the present invention is so constructed that the response speed to the level change of the output voltage detection value to be given to the differential amplifier circuit becomes higher than that to the level change of the actual output voltage, the conduction conditions of the transistors for outputting an intermediate potential can be released before reaching the reference level. As a result, it is possible to control the intermediate potential output level at the reference potential stably, without causing any trouble such as oscillation.

Successively, various application examples of the constant potential generating circuit according to the present invention will be explained hereinbelow. The first application example relates to a driving circuit suitable for an output driving circuit (a circuit for driving output pads) of a semiconductor memory device (e.g., DRAM). Further, the second application example relates to an internal supply voltage generating circuit suitable for a semiconductor memory device (e.g., DRAM). Further, the third application example relates to a word line driving circuit of a DRAM, and the fourth application example relates to a bit line potential generating circuit and a plate potential generating circuit of a DRAM.

(First Application Example)

In the semiconductor integrated circuit devices, the elements have been microminiaturized more and more with the advance of needs to a higher integration density. Due to the advance of the microminiaturization, when an external supply voltage Vcc is directly supplied to the integrated circuit formed on a semiconductor substrate, various problems arise in that the gate oxide films of the elements are broken down or hot carriers may generated, etc., thus resulting in the deterioration of durability and reliability of the functions of the integrated circuits. To overcome this problem, it has been necessary to provide an internal supply voltage deboosting circuit for lowering an external supply voltage inside the semiconductor integrated circuit. For instance, when an external supply voltage Vcc of about 5V is dropped down to about 3V by an internal supply voltage deboosting circuit, it is possible to reduce the power consumption of the semiconductor device when the internally deboosted voltage is used as the supply voltage.

For the reason as described above, the internal supply voltage deboosting circuit has been adopted. However, it has been difficult to secure a margin for both the low voltage operation and the high voltage operation within the same integrated circuits. Therefore, when the supply voltage is relatively low, since the drive capability of the transistors decreases, the conductance of the data outputting transistors and the internal supply voltage driving transistors are determined large to compensate for a drop of the transistor drive capability, that is, for compensation for the data output delay and the voltage drop of the internal deboosted supply voltage. Further, when the supply voltage is relatively high, since the drive capability of the transistors increases, output noise increases. As the countermeasures against the above-mentioned problems, it is necessary to use a switching circuit to increase the conductance of the data outputting transistors and the internal supply voltage driving transistors when the supply voltage low, as compared with when the supply voltage is high.

Figure 8:
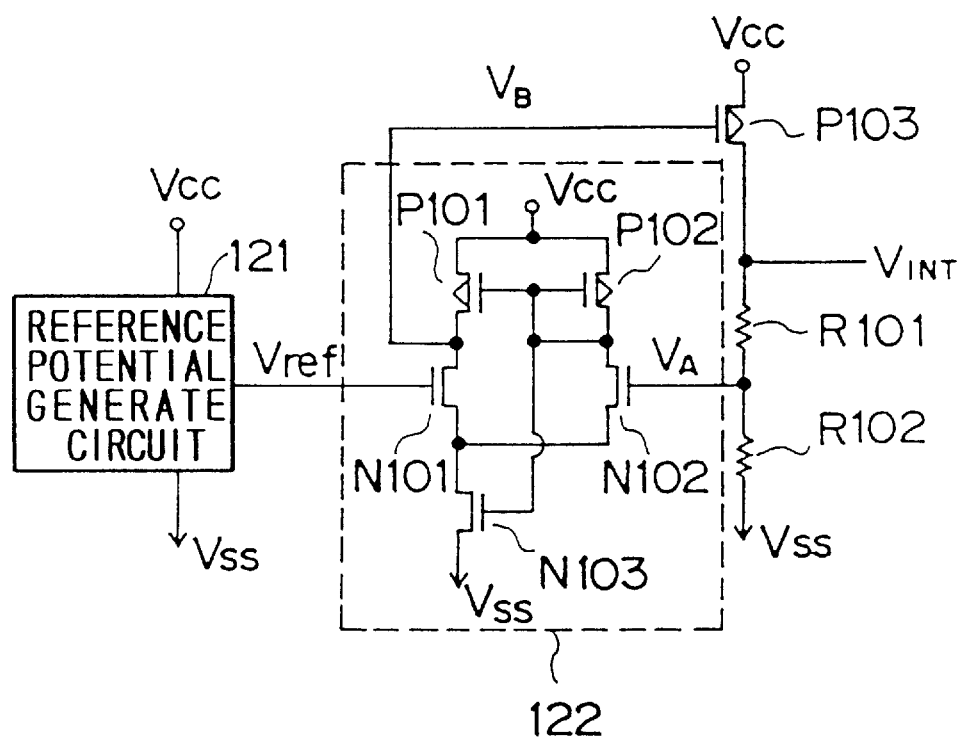
FIG. 8 is a circuit diagram showing an internal deboosting circuit (internal supply voltage deboosting circuit) used for the reference voltage generating circuit shown in FIG. 7(b)
Figure 9:
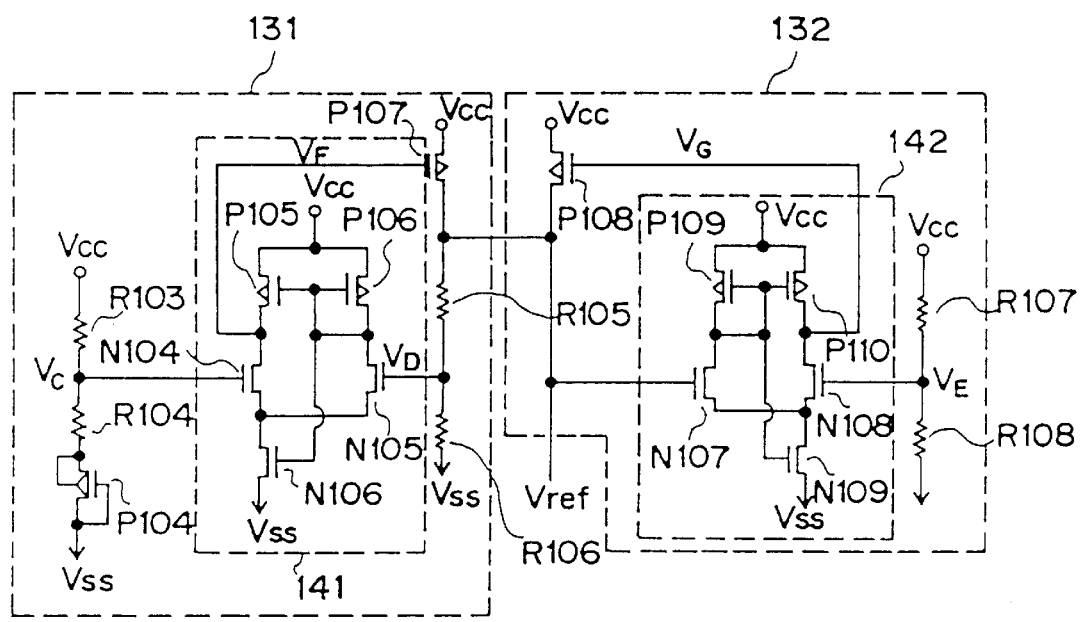
FIG. 9 is a circuit diagram showing a reference potential generating circuit used for the circuit shown in FIG. 8.
Figure 10:
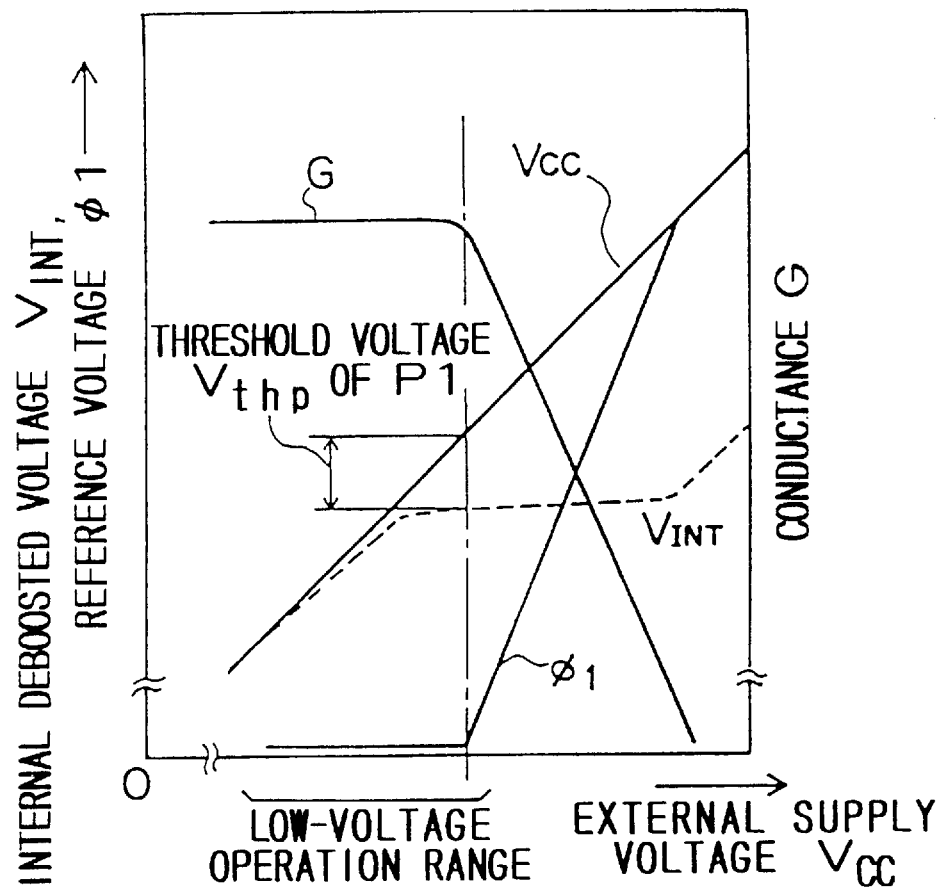
FIG. 10 is a characteristic diagram showing the dependency of the voltage generated by the reference voltage generating circuit shown in FIG. 7 and the conductance of the transistor P1 upon the external supply voltage.

The first application example will be explained with reference to FIGS. 7(a) and 7(b), 8, 9 and 10. FIG. 7(a) is a circuit diagram showing an output circuit of a semiconductor integrated circuit device, and FIG. 7(b) is a circuit diagram showing a reference voltage generating circuit used to control the gate voltage of a P-channel transistor of the output circuit. FIG. 8 is a circuit diagram showing an internal deboosting circuit used for the circuit shown in FIG. 7(b). FIG. 9 is a circuit diagram showing a reference potential generating circuit used for the circuit shown in FIG. 8. FIG. 10 is a graphical representation showing the dependency characteristics of the reference voltage φ1 and the conductance G upon the external supply voltage $V_{CC}$, in which the external supply voltage $V_{CC}$ is taken on the abscissa; and the internal supply voltage $V_{INT}$, the reference voltage φ1 and the conductance G of the P-channel transistor P1 are all taken on the ordinate. The reference voltage generating circuit 1 shown in FIG. 7(b) is composed of a P-channel transistor P1 having a source connected to an external supply voltage $V_{CC}$, a gate connected to an internal supply voltage $V_{INT}$, and a resistor R1 having one end directly connected to the drain of the transistor P1 and the other end connected to a ground voltage. Further, a reference voltage φ1' is taken out of an intermediate tap between the transistor P1 and the resistor R1. Now, in the range where the gate-source voltage Vgs ($V_{CC}-V_{INT}$) is lower than the threshold voltage Vthp of the transistor P1, since the transistor P1 is cut off, the reference voltage φ1' is at a low level. However, in the range where the Vgs ($V_{CC}-V_{INT}$) is higher than the threshold voltage Vthp, the transistor P1 begins to turn on.

In the range where the transistor P1 begins to turn on, since the conductance G of the P-channel transistor P1 is small, the reference voltage φ1' can be decided on the basis of a voltage division ratio of the transistor P1 and the resistor R1. That is, if the resistance of the transistor P1 is denoted by R and the resistance of the resistor R1 is denoted by R1, φ1' can be represented by R1×$V_{CC}$/(R1+R). Therefore, since the conductance G of the transistor P1 increases with increasing gate voltage of the transistor P1, the reference voltage φ1' increases in analog manner in linkage with an increase of the external supply voltage $V_{CC}$. When the external supply voltage Vcc further increases, since the gate-source voltage ($V_{CC}-V_{INT}$) of the transistor P1 increases sufficiently high, the resistor of the transistor P1 becomes negligibly small in comparison with the resistance of the resistor R1. Under these conditions, since the voltage drop of the transistor P1 can be almost omitted, the level of the reference voltage φ1' becomes roughly equal to the level of the external supply voltage $V_{CC}$.

FIG. 7(a) shows an output circuit using the reference voltage φ1' having the characteristics as described above. This output circuit is composed of a P-channel transistor P4 having a gate connected to the reference voltage generating circuit 1 via an amplifier, a P-channel transistor P3 having a source connected to the drain of the P-channel transistor P4 and a gate connected to a data output control circuit 3, and a P-channel transistor P2 having a gate also connected to the data output control circuit 3. The drains of the two P-channel transistors P2 and P3 are connected to an input/output terminal (I/O pad) 4. Here, the transistor P2 constructs a full-voltage operation output section 5 which can operate without depending upon the external supply voltage $V_{CC}$, and the transistors P3 and P4 construct a low-voltage operation output section 6 which can operate only below a predetermined low voltage. Further, the transistor P4 operates only when the external supply voltage $V_{CC}$ is lower than a predetermined voltage, and controlled by a gate signal φ1 obtained by amplifying the reference voltage φ1' generated by the reference voltage generating circuit 1 through the amplifier circuit AMP. The construction of the amplifier circuit AMP is of any type of the circuits shown in FIGS. 1, 5 and 6, in which the reference voltage $V_{ref}$ corresponds to φ1' and the output voltage $V_{out}$ corresponds to φ1. The transistor P2 is always operated on the basis of the control signal φH of the data output control circuit 3, without depending upon the external supply voltage $V_{CC}$. On the other hand, the transistor P3 is controlled on the basis of the control signal φH. The transistor P4 connected in series to the transistor P3 is controlled on the basis of the reference voltage φ1 which depends upon the external supply voltage $V_{CC}$ as shown in FIG. 10. In a low voltage range (in which the external supply voltage $V_{CC}$ does not reach a predetermined voltage), the transistor P4 is perfectly turned on, so that the conductance of the output transistor can be increased.

In the vicinity at which the low voltage is switched to the high voltage or vice versa, since the reference voltage φ1 changes continuously in analog manner, the conductance does not change abruptly in the vicinity of the voltage switching point, with the result that it is possible to markedly improve the harmful influence of the output noise. In addition, when the external supply voltage increases, since the level of the reference voltage φ1 becomes roughly equal to the external supply voltage, the transistor P4 is perfectly turned off. Therefore, the conductance G of the output transistor can be reduced in the high voltage operation range, so that the output noise can be reduced. As described above, since the amplifier AMP is interposed between the reference voltage generating circuit 1 and the circuit 6 as shown in FIG. 7(a), it is possible to obtain high speed and high stable output control.

FIG. 8 shows the internal supply voltage deboosting circuit (shown in FIG. 7(b)) for generating an internal supply voltage $V_{INT}$ to be used for the semiconductor integrated circuit device shown in FIG. 7(a). As shown in FIG. 10, the internal supply voltage $V_{INT}$ changes roughly linearly at the low voltage in the same way as with the case of the external supply voltage $V_{CC}$, stays at a constant level with respect to the change in the external supply voltage $V_{CC}$, and further rises linearly in the same way as with the case of the external supply voltage $V_{CC}$ after the external supply voltage $V_{CC}$ exceeds a predetermined value. Here, the voltage value from which the internal supply voltage $V_{INT}$ begins to rise is denoted by $V_{cur}$. In this embodiment, although the internal supply voltage changes as described above, without being limited only thereto, it is also possible to use another internal supply voltage whose change rate is slightly smaller than the external supply voltage.

The internal voltage deboosting circuit shown in FIG. 8 has a reference potential generating circuit 121, a P-channel transistor P103 for driving an internal voltage supply, P-channel transistors P101 and P102 for controlling the switching operation of the P-channel transistor P103, a current mirror type differential amplifier 122 composed of two N-channel transistors N101, N102 and N103, and two resistors R101 and R102. The reference potential generating circuit 121 generates the reference voltage $V_{ref}$ on the basis of the external supply voltage $V_{CC}$. Further, a voltage difference between the internal supply voltage $V_{INT}$ outputted by the P-channel transistor P103 and the ground voltage $V_{SS}$ is divided by the resistor R101 and the transistor P102, so that a potential $V_A$ can be generated.

This reference potential $V_{ref}$ and the potential $V_A$ are both inputted to the gates of the two N-channel transistors N101 and N102 of the differential amplifier 122, respectively. When the external supply voltage $V_{CC}$ is relatively low, the potential $V_A$ is lower than the operation reference potential $V_{ref}$. In this case, the output voltage $V_B$ of the differential amplifier section 122 becomes a low level, so that the P-channel transistor P103 is turned on. Here, if the dimension of the P-channel transistor P103 is so determined that the resistance of the transistor P103 becomes sufficiently smaller than those of the resistors R101 and R102, it is possible to obtain an internal supply voltage $V_{INT}$ roughly equal to the external supply voltage $V_{CC}$. In contrast with this, when the external supply voltage $V_{CC}$ is high, the potential $V_A$ becomes higher than the reference potential $V_{ref}$. In this case, the output voltage $V_B$ of the differential amplifier section 122 is at a high level, so that the P-channel transistor P103 is turned off. Therefore, the voltage level of the internal supply voltage $V_{INT}$ drops due to discharge through the resistors R101 and R102. Here, when the potential $V_A$ drops lower than the reference potential $V_{ref}$, since the P-channel transistor P103 is turned on again, the internal supply voltage $V_{INT}$ can be maintained at a constant level. As a result, the internal supply voltage $V_{INT}$ can be kept at a constant level at a point at which the potential $V_A$ is equal to the reference potential $V_{ref}$.

As described above, when the external supply voltage $V_{CC}$ is relatively low, the reference potential $V_{ref}$ becomes higher than the potential $V_A$, so that the internal supply voltage $V_{INT}$ roughly equal to the external supply voltage $V_{CC}$ can be obtained. When the external supply voltage $V_{CC}$ is high, on the other hand, the internal supply voltage $V_{INT}$ can be kept at a constant level at a point at which the reference potential $V_{ref}$ is equal to the potential $V_A$.

FIG. 9 shows a practical circuit construction of the reference potential generating circuit 121 (shown in FIG. 8) used for the internal supply voltage deboosting circuit for forming the internal supply voltage $V_{INT}$. The reference potential generating circuit 121 is composed of two circuits 131 and 132. The circuit 131 decides the characteristics of the reference potential $V_{ref}$ when the external supply voltage $V_{CC}$ ranges from 0 to $V_{cur}$. Here, the voltage $V_{cur}$ corresponds to the external supply voltage $V_{CC}$ obtained when the reference potential $V_{ref}$ becomes equal to the voltage $V_E$ of the circuit 132 (described later). The internal supply voltage $V_{INT}$ rises beginning from this voltage $V_{cur}$, as shown in FIG. 10. Further, the circuit 132 decides the characteristics of the reference potential $V_{ref}$ when the external supply voltage $V_{CC}$ is higher than $V_{cur}$.

In the circuit 131, two resistors R103 and R104 and a P-channel transistor P104 are connected in series, and the voltage $V_C$ is generated from a node between the two resistors R103 and R104. The resistance value of this resistor R103 is determined sufficiently larger than that of the resistor R104. Therefore, the voltage $V_C$ is kept at a constant level without depending upon the external supply voltage $V_{CC}$. This voltage $V_C$ is inputted to a differential amplifier section 141 composed of P-channel transistors P105 and P106 and N-channel transistors N104, N105 and N106.

Further, between the external supply voltage $V_{CC}$ and the ground voltage $V_{SS}$, a P-channel transistor P107 and two resistors R105 and R106 are connected in series, and the voltage $V_D$ is outputted from a node between the two resistors R105 and R106. These voltage $V_D$ and $V_C$ are both inputted to the differential amplifier section 141. In the circuit 131, in the same way as with the case shown in FIG. 8, when the external supply voltage $V_{CC}$ is high, the reference potential $V_{ref}$ outputted from the node between the P-channel transistor P107 and the resistor R105 can be kept at a constant level. The circuit 132 is composed of two resistors R107 and R108, a differential amplifier section 142, and a P-channel transistor P108 (as a driving transistor). In the differential amplifier section 142, the potential $V_E$ (obtained by dividing the external supply voltage $V_{CC}$ by the resistors R107 and R108) and the reference voltage $V_{ref}$ are inputted for comparison between the two voltages. When the external supply voltage $V_{CC}$ is between 0 and $V_{cur}$, the reference voltage $V_{ref}$ is higher than the potential $V_E$.

In this case, an output voltage $V_G$ of the differential amplifier section 142 is at a high level, so that the P-channel transistor P108 is turned off. As a result, the level of the reference voltage $V_{ref}$ can be decided by only the circuit 131. When the external supply voltage $V_{CC}$ becomes higher than the voltage $V_{cur}$, the reference voltage $V_{ref}$ becomes lower than the potential $V_E$. As a result, since the output voltage $V_G$ of the differential amplifier section 142 becomes a low level, the P-channel transistor P108 is turned on, so that the voltage $V_D$ of the circuit 131 rises. By this, an output voltage $V_F$ of the differential amplifier section 141 of the circuit 131 becomes a high level, so that the P-channel transistor P107 is turned off. As a result, the reference voltage $V_{ref}$ can be decided by only the circuit 132. When the external supply voltage further rises, the reference voltage $V_{ref}$ also rises. Further, the internal supply voltage $V_{INT}$ rises in the range in which the external supply voltage $V_{CC}$ is higher than the voltage $V_{cur}$. This is because in the case of products of an external supply voltage $V_{CC}$=5V, although the service voltage range is from 4.5V to 5.0V, the products are tested in burn-in operation at a voltage higher than the service voltage.

(First Modification of the First Application)

A first modification of the first application will be explained with reference to FIGS. 11(a) and 11(b), in which FIG. 11(a) shows a semiconductor integrated circuit device provided with an output circuit for outputting high- and low-level outputs, and FIG. 11(b) shows the reference voltage generating circuit for generating the reference voltage $\phi 2'$ used by the output circuit.

The output circuit shown in FIG. 11(a) uses the reference voltage generating circuit 1 shown in FIG. 7(b) and the reference voltage generating circuit 2 shown in FIG. 11(b). The reference voltage generating circuit 2 has a resistor R2 connected to an external supply voltage $V_{CC}$, and an N-channel transistor N4 connected in series with this resistor R2. The gate of this transistor N4 is connected to the reference voltage φ1' outputted by the reference voltage generating circuit 1. Further, the reference voltage φ2' is taken out from an intermediate tap between the transistor N4 and the resistor R2. As already explained, the reference voltage φ1' outputted by the reference voltage generating circuit 1 rises in analog manner with increasing external supply voltage $V_{CC}$. On the other hand, the reference voltage φ2' changes in opposite way to φ1'.

Figure 7:
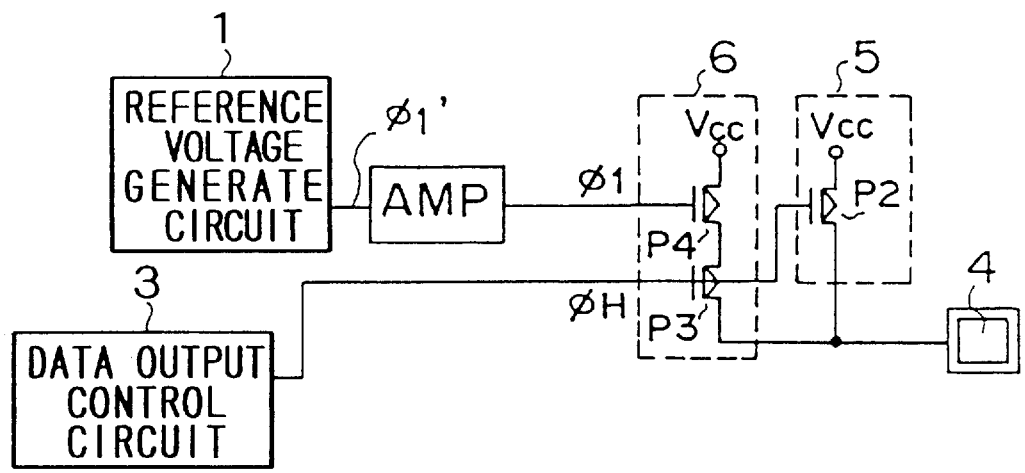
FIG. 7(a) is a circuit diagram showing a first application example of the semiconductor integrated circuit device according to the present invention.
FIG. 7(b) is a circuit diagram showing a reference voltage generating circuit used for the semiconductor integrated circuit device shown in FIG. 7(a)
Figure 7:
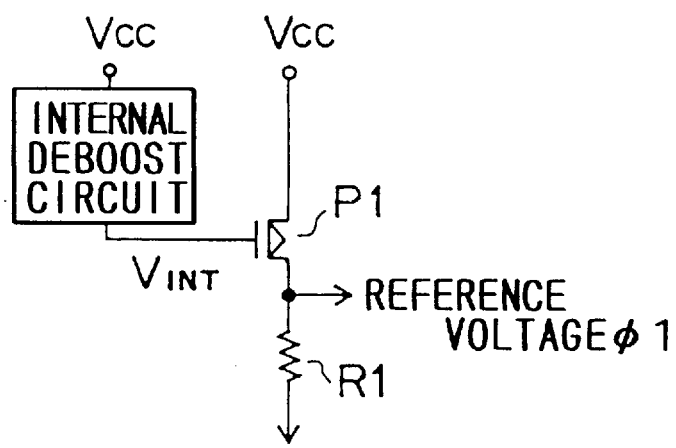

In the same way as in FIG. 7, the output circuit shown in FIG. 11(a) has a P-channel transistor P2, a P-channel transistor P3, a P-channel transistor P4, and further an N-channel transistor N1 connected in series with the transistor P2, an N-channel transistor N3 connected in parallel to the transistor N1 and in series with the transistor P2, and an N-channel transistor N2 connected in series with the transistor N3.

The four drains of the transistors P2, P3, N1 and N3 are connected to an input/output terminal (I/O pad) 4. The transistor P2 constructs a full-voltage operation output section 5 of a high level ("1") output, and the transistors P3 and P4 construct a low-voltage operation output section 6 of a high level ("1") output. Further, the transistor N1 constructs a full-voltage operation output section 51 of a low level ("0") output, and the transistors N2 and N3 construct a low-voltage operation output section 61 of a low level ("0") output. The high-level outputting transistor P2 and the low-level outputting N1 are not dependent upon the external supply voltage $V_{CC}$, and are always operated a high-level control signal φH and a low-level control signal φL of the data output control circuit 3. On the other hand, when the reference voltage φ1 having the dependency upon the external supply voltage as shown in FIG. 10 is used to control the transistor P4 connected in series with the transistor P3 controlled by the control signal φH, since the transistor P4 can be perfectly turned on at the low voltage (when the external supply voltage does not reach a predetermined value), it is possible to increase the conductance of the output transistor. In the vicinity at which the low voltage is switched to the high voltage or vice versa, since the reference voltage φ1 changes continuously in analog manner, an abrupt change in conductance of the output transistor can be prevented in the vicinity of the switch point. As a result, it is possible to improve the harmful influence of the output noise markedly.

In addition, when the external supply voltage rises, since the level of the reference voltage φ1 becomes roughly equal to the external supply voltage $V_{CC}$, the transistor P4 is perfectly turned off, so that the conductance of the output transistor can be reduced in the high voltage operation, thus resulting in a reduction of the output noise. Further, the same advantage can be applied to the low-level output in the same way. In this case, the transistor N2 connected in series with the transistor N3 controlled by the control signal φL is controlled by the reference voltage φ2' (as shown in FIG. 11(b)) opposite in phase to the reference voltage φ1. Further, in the reference potential generating circuit show in FIG. 11(b), it is also possible to replace the supply voltage $V_{CC}$ with the internal supply voltage $V_{int}$.

In the modification as explained above, the amplifier AMP as already explained with reference to FIGS. 1 and 6 is used for amplification, the output operation can be effected stably at a high speed.

(Second Modification of the First Application)

Figure 12:
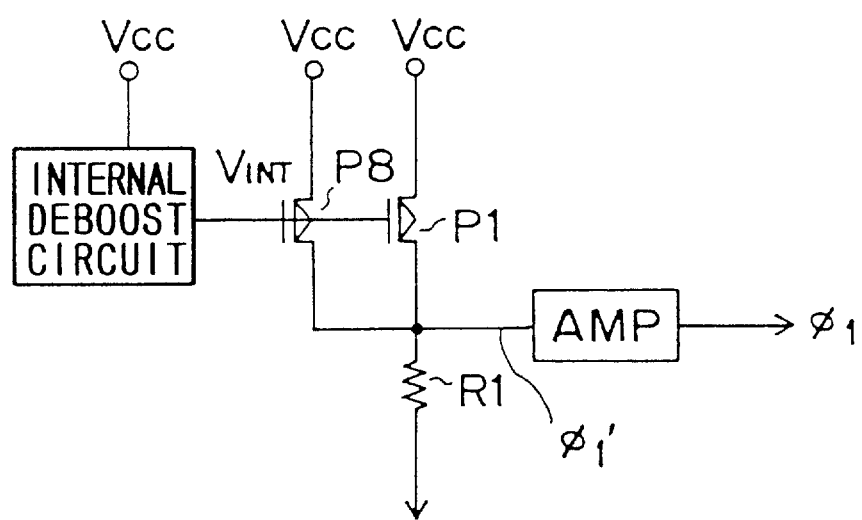
FIG. 12 is a circuit diagram showing a second modification of the first application example of the present invention.

A second modification of the first application will be explained with reference to FIG. 12, in which the reference voltage generating circuit used for this embodiment is shown. The reference voltage generating circuit has a P-channel transistor P1 having a source connected to an external supply voltage $V_{CC}$ and a gate connected to an internal supply voltage $V_{INT}$, a P-channel transistor P8 having a source connected to an external supply voltage $V_{CC}$ and a gate connected to an internal supply voltage $V_{INT}$, and a resistor R1 connected in series to the drains of the two transistors P1 and P8 at one end thereof and to a ground supply voltage $V_{SS}$. The reference voltage φ1' is taken out of an intermediate tap between the two transistors P1 and P8 and the resistor R1. As already explained, in the range where the Vgs ($V_{CC}-V_{INT}$) is lower than the threshold voltage, since the transistor is turned off, the reference voltage φ1' is at the low level. However, when the Vgs ($V_{CC}-V_{INT}$) becomes higher than the threshold voltage, the transistor begins to turn on. In this turn-on start range, since the conductance of the transistor is small, the reference voltage φ1' is decided by the voltage division ratio of the two transistors and the resistor.

Therefore, since the conductances of the two transistors increase with increasing gate voltages of the two transistors, the reference voltage φ1' eventually rises in analog manner in linkage with the increase of the external supply voltage $V_{CC}$. When the external supply voltage $V_{CC}$ further increases, the gate voltage of the transistors rise sufficiently high, the resistances of the transistors P1 and P8 become negligibly small in comparison with the resistance of the resistor R1. Under these conditions, since the voltage drop of the transistors P1 and P8 can be roughly omitted, the level of the reference voltage φ1' becomes roughly equal to the level of the external supply voltage $V_{CC}$. In this embodiment, two transistors P1 and P8 having mutually different threshold voltages Vt1 and Vt2 are used. For instance, if |Vt1|<|Vt2|, in the range where the gate-source voltages ($V_{CC}-V_{INT}$) of the transistors are lower than the threshold voltages |Vt1| and |Vt2|, since the two transistors are turned off, the reference voltage φ1' is at a low level. Further, when the gate-source voltage ($V_{CC}-V_{INT}$) of one transistor P1 is higher than the threshold voltage Vt1 of the transistor P1 but lower than the threshold voltage Vt2 of the transistor P8, only the transistor P1 begins to turn on.

When the gate-source voltage ($V_{CC}-V_{INT}$) becomes higher than the threshold voltages of both the transistors P1 and P8, the transistor P8 begins to turn on. When the external supply voltage $V_{CC}$ rises sufficiently high, since the gate voltages of both the transistors rise sufficiently high, the divided voltage by the transistors becomes almost zero, so that the reference voltage level φ1' becomes almost equal to the external supply voltage $V_{CC}$. Consequently, the reference voltage φ1' rises more abruptly than the previous range. Further, in this embodiment, although two transistors are used, it is preferable to increase the number of the transistors. In this case, it is possible to increase the reference voltage along a curve in such a way as to first rise gently but rise abruptly as approaching the external supply voltage $V_{CC}$. Even if a plurality of the transistors are used, the conductances of the transistors can be changed continuously (without generating discontinuous points), and further all the transistors can be turned off perfectly in the high voltage operation range. The reference voltage can be used for an internal supply voltage driving transistor or for a data outputting transistor.

In the modification as explained above, the amplifier AMP as already explained with reference to FIGS. 1 and 6 is used for amplification, the output operation can be effected stably at a high speed.

(Third Modification of the First Application)

Figure 13A:
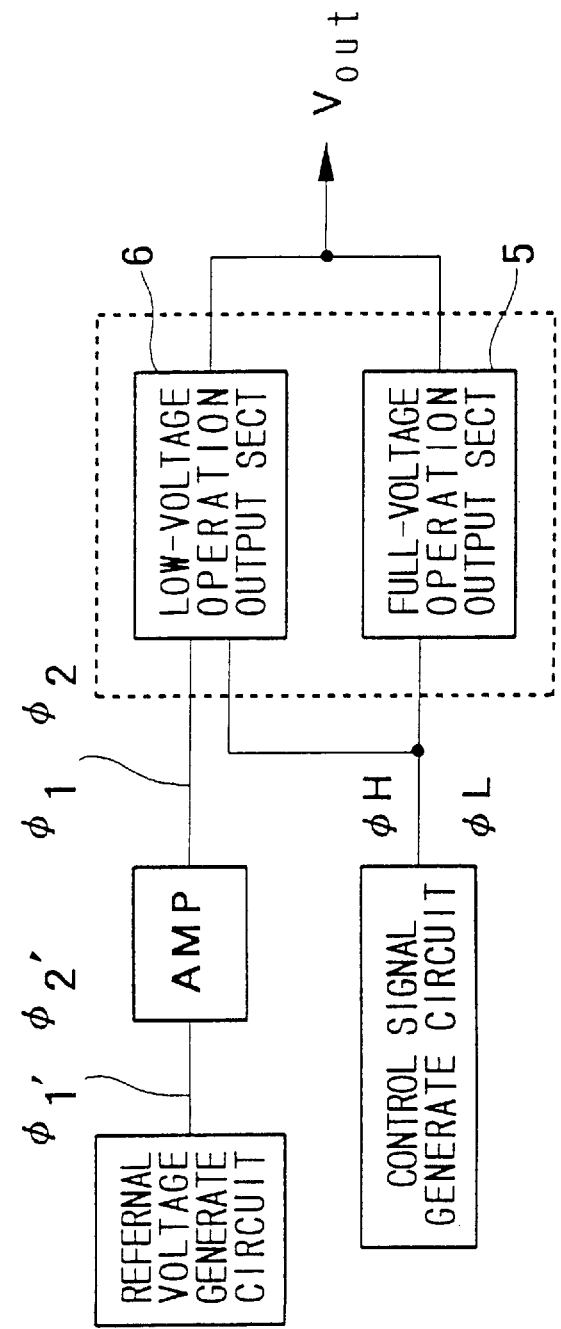
FIG. 13A is a circuit diagram showing a third modification of the first application example of the present invention.

A third modification of the first application will be explained with reference to FIGS. 13A and B and FIG. 14. FIG. 13A is a block diagram showing an output section of the transistor operated at a predetermined supply voltage. On a semiconductor substrate, a full-voltage operation output section 5 and a low-voltage operation output section 6 are formed as the output section. In addition, a reference voltage generating circuit for generating a reference voltage φ1', φ2' and a control signal generating circuit for generating a control signal φH and φL are formed. In the integrated circuit device as described above, when the external supply voltage $V_{CC}$ is higher than a predetermined voltage, the full-voltage operation section 5 operates under control of the output signal φH/φL outputted by the control signal generating circuit, to output an output voltage $V_{out}$. On the other hand, when the external supply voltage $V_{CC}$ is lower than a predetermined voltage, the low-voltage operation section 6 operates under control of the output signal φH/φL outputted by the control signal generating circuit. Further, operation transistors (not shown) are controlled by the reference voltage φ1 or φ2 obtained by amplifying the reference voltage φ1' or φ2' generated by the reference voltage generating circuit 1 via the amplifier AMP as shown in FIGS. 1 to 6, to output the output voltage $V_{out}$. In the case where the operation transistor is of internal supply voltage driving type, the internal supply voltage $V_{INT}$ is outputted as the output voltage $V_{out}$. In the case where the output voltage is used as data output, this output is outputted from an output terminal (not shown) of the semiconductor substrate. The reference voltage φ1 or φ2 inputted to the low-voltage operation output section 6 has the dependency upon the external supply voltage as shown in FIG. 10. The reference voltage φ1' or φ2' is outputted from he reference voltage generating circuit. The generated reference voltage is applied to the gate of the operation transistor to control the transistor. By use of the reference voltage φ1 or φ2 as described above, it is possible to prevent an abrupt change of the internal deboosted voltage due to change in abrupt change in conductance of the operation transistor in the range where the supply voltage is switched from a high voltage to a low voltage or vice versa, or to prevent the switching noise, thus realizing a stable operation while securing a margin.

Figure 13B:
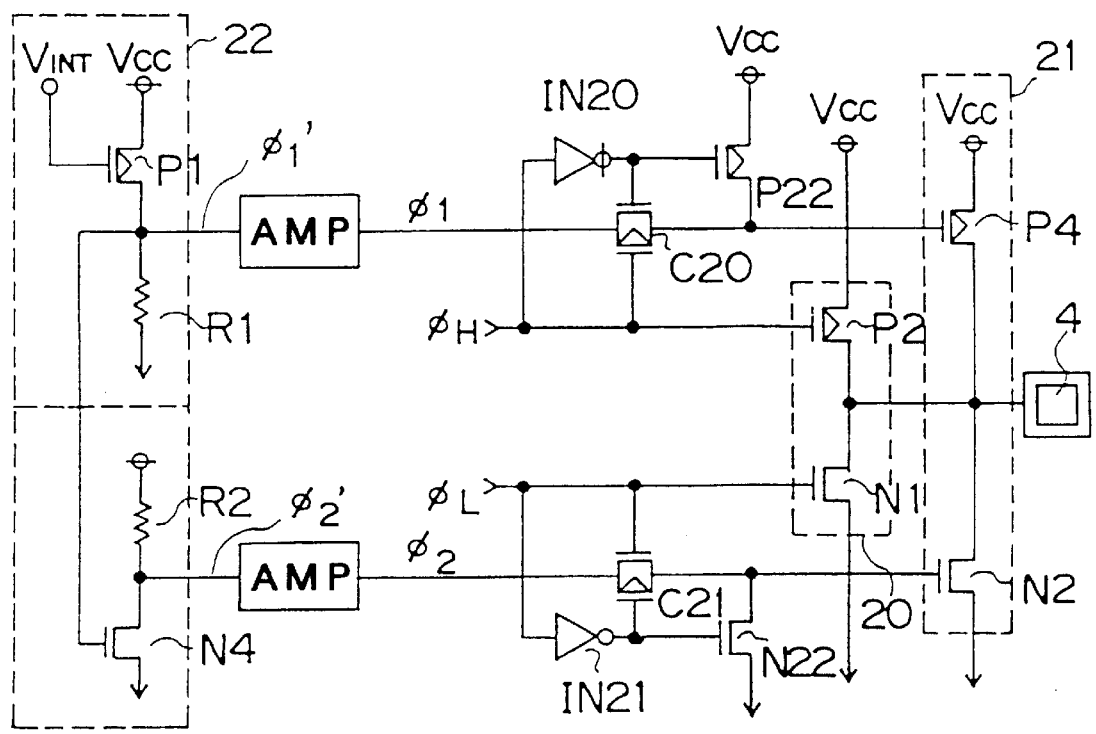
FIG. 13B is a circuit diagram showing a fourth modification of the first application example of the present invention.

FIG. 13B is a circuit diagram showing an output circuit of the semiconductor integrated circuit device shown in FIG. 13A. The output circuit has a low-voltage operation output section 21 operated only in a range where the external supply voltage $V_{CC}$ is lower than a predetermined constant voltage, a full-voltage operation output section 20 operated only in all the range, and an input/output terminal 4 connected to an output side of these output sections. Further, a reference voltage generating circuit 22 is formed to generate two reference voltages φ1' and φ2' applied to the gates of two transistors P4 and N2 of the low-voltage operation output section 21. The output transistors P2 and N1 of the full-voltage operation output section 20 are both controlled by control signals φH and φL generated by an output control circuit (not shown) and applied to the gates of these transistors. The reference voltages φ1 and φ2 (obtained by amplifying φ1' and φ2') are applied to the gates of the two transistors P4 and N2 via two CMOS transfer gates C20 and C21, respectively.

In the case of a high level output, the gate signal φH of the high-level output control signal is connected to the gate of the P-channel transistor for constructing the CMOS transfer gate C20, and the gate signal φL (obtained by inverting φH through an inverter IN20) is connected to the gate of the N-channel transistor for constructing the transfer gate C20. In the construction as described above, when the gate signal φH changes to a low level, the transfer gate C20 is turned on (into a transferable status), so that the reference voltage φ1 can be applied to the gate of the output transistor P4 of the low-voltage operation output section 21.

As a result, on the basis of the reference voltage φ1 dependent upon the external supply voltage (as shown in FIG. 10), it is possible to continuously change the conductance of the output transistor P4 substantially in analog manner in the range where the low-voltage operation is switched to the high-voltage operation or vice versa according to the external supply voltage $V_{CC}$. Further, when the high level voltage is not outputted, a P-channel transistor P22 fixes the gate level of the output transistor P4 at the high level, so that this transistor P4 can be kept turned off.

In the case of a low level output, in the same way as with the case of the high level voltage output, the gate signal φL of the low-level output control signal is connected to the gate of the N-channel transistor for constructing the CMOS transfer gate C21, and the gate signal φH (obtained by inverting φL through an inverter IN21) is connected to the gate of the P-channel transistor for constructing the transfer gate C21. In the low-level output as described above, when the gate signal φL changes to a high level, the transfer gate C21 is turned on (into a transferable status), so that the reference voltage φ2 can be applied to the gate of the output transistor N2 of the low-voltage operation output section 21.

As a result, on the basis of the reference voltage φ2 opposite in phase to the reference voltage φ1, the transistor N2 can be controlled. Further, when the low level voltage is not outputted, an N-channel transistor N22 fixes the gate level of the output transistor N2 at the low level, so that this output transistor N2 can be kept turned off.

As described above, the voltage changes substantially in analog manner in proportion to the supply voltage according to a difference between the supply voltage and a predetermined level reference voltage. Further, since this voltage is applied to the internal supply voltage driving transistor or the outputting transistor as the gate voltage, respectively, it is possible to prevent the internal deboosted voltage from being changed abruptly due to an abrupt change of the conductance of these transistors and thereby switching noise at the point where the low voltage is switched to the high voltage or vice versa, thus realizing a stable operation having an appropriate margin. Further, here, since the two amplifiers AMP are inserted in the circuit shown in FIG. 14, a stable and high speed operation can be securely obtained.

(Fourth Modification of the First Application)

Successively, the fourth modification of the first application will be explained with reference to FIG. 14.

Figure 14:
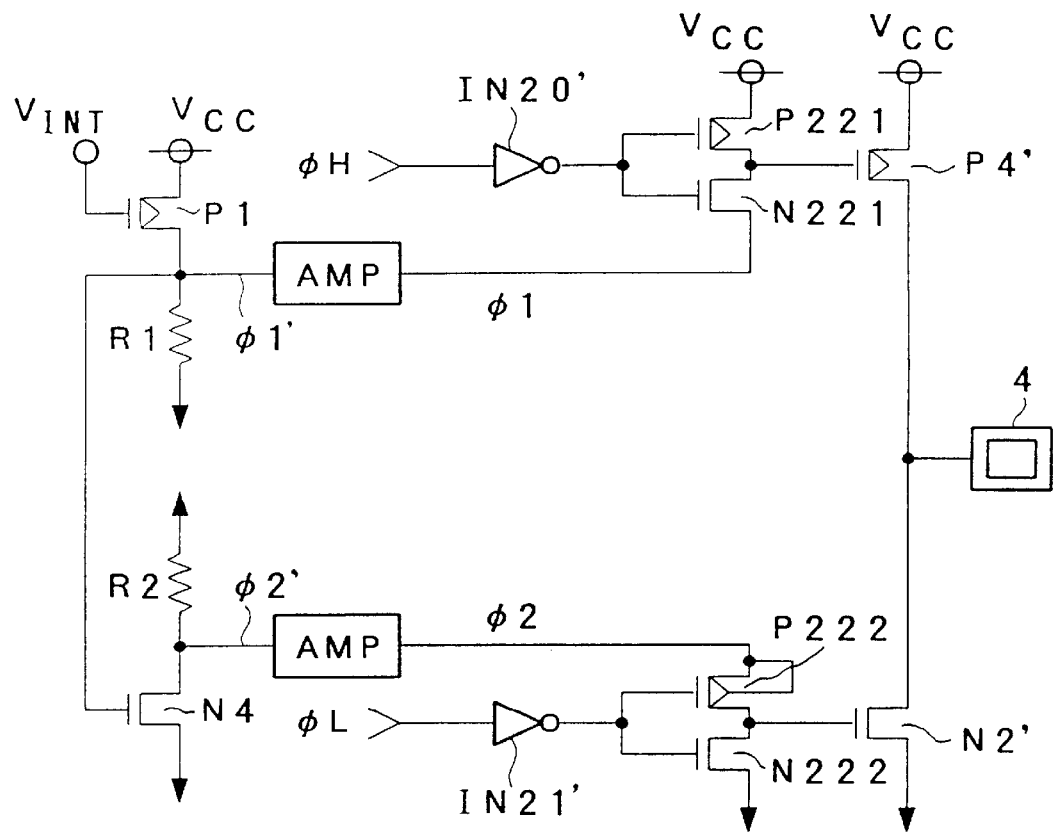
FIG. 14 is a circuit diagram showing a modification of the circuit diagram showing in FIG. 13B.

FIG. 14 is a modification of the circuit shown in FIG. 13B. In FIG. 14, a transistor P4' is provided instead of the transistors P2 and P4, and a transistor N2' is provided instead of the transistors N1 and N2. The signal φH is applied to a gate of the transistor P4' via the inverter IN20[1] and the transistors P221 and N221, and the signal φL is applied to the gate of the transistor N2' via the inverter IN21[1] and the transistors P222 and N222. Further, both the signals φ1 and φ2 are applied to the transistors N221 and P222, respectively.

In this modification, the output transistors for driving the pad 4 are only the P-channel transistor P4 and the N-channel transistor N2. These two transistors are driven by inverter circuits IN30, IN31, IN32 and IN33. Since φ1 and φ2 are roughly the same as those of the output circuit shown in FIG. 13, the detailed description thereof is omitted herein. The IN31 uses φ1 as the low potential side supply voltage and the IN33 uses φ2 as the high potential side supply voltage. As a result, IN31 drives the gate of the transistor P4 within an amplitude range between φ1 and $V_{CC}$, and IN33 drives the gate of the transistor N2 within an amplitude range between $V_{SS}$ and φ2.

As a result, since a voltage which changes substantially in an analog form in proportion to the supply voltage can be applied, as a gate voltage, to the internal supply voltage driving transistor and the outputting transistor, it is possible to prevent switching noise and to realize a stable operation, while securing a margin. Here, since an amplifier is inserted, a stable and high speed operation can be secured.

In addition, in this modification, since the number of the transistors to be driven can be reduced two, as compared with the circuit construction shown in FIG. 13, this is more preferable when the circuit is required to be integrated.

(Second Application)

Figure 15:
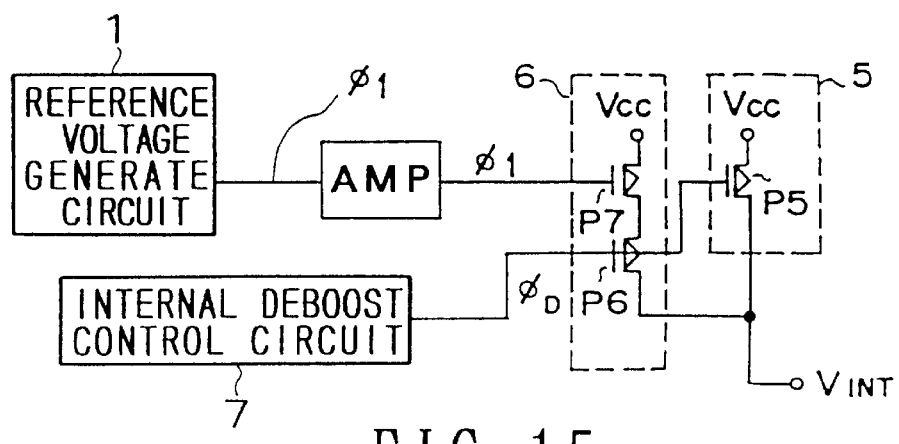
FIG. 15 is a circuit diagram showing a second application example of the present invention.

The second application will be explained with reference to FIG. 15, which is an internal supply voltage deboosting circuit on the basis of the reference voltage φ1 having the characteristics as shown in FIG. 10. In FIG. 15, the internal deboosted supply voltage driving transistor and the internal deboosting control circuit both operated on the basis of the external supply voltage $V_{CC}$ are shown. The circuit is composed of a P-channel transistor P7 having a source connected to the external supply voltage $V_{CC}$ and a gate connected to the reference voltage generating circuit 1, and a P-channel transistor P6 having a source connected to the drain of the transistor P7 and a gate connected to an internal voltage deboosting control circuit 7, and a P-channel transistor P5 having a source connected to the external supply voltage $V_{CC}$ and a gate connected to an internal voltage deboost control circuit 7. Further, an internal supply voltage $V_{INT}$ is outputted from the drains of the two transistors P5 and P6. In the drawing, the transistor P5 is operative without depending upon the external supply voltage.

The transistor P7 operates, only when the external supply voltage is lower than a predetermined voltage, under control of the gate signal φ1 outputted by the reference voltage generating circuit 1. Further, the transistor P5 is provided with a high-voltage operation range having the transistor P5 and a low-voltage operation range having the two transistors P6 and P7. The internal supply voltage driving transistor P5 is controlled by only a control signal φD applied by the internal deboost control circuit 7.

In the same way, the transistor P6 is controlled on the basis of the control signal φD. The reference voltage φ1 is applied to the gate of the transistor P7 connected in series to this transistor P6.

In the same reason as describe already in the first application, it is possible to prevent the internal deboosted voltage from being changed abruptly due to an abrupt change of the conductances of these transistors and thereby to prevent the switching noise at the point where the low voltage is switched to the high voltage or vice versa, thus realizing a stable operation having an appropriate margin. Further, here, since the amplifier AMP as explained with reference to FIG. 1 or 6 is used for amplification, a stable and high speed operation can be securely obtained.

(Third Application)

Figure 16:
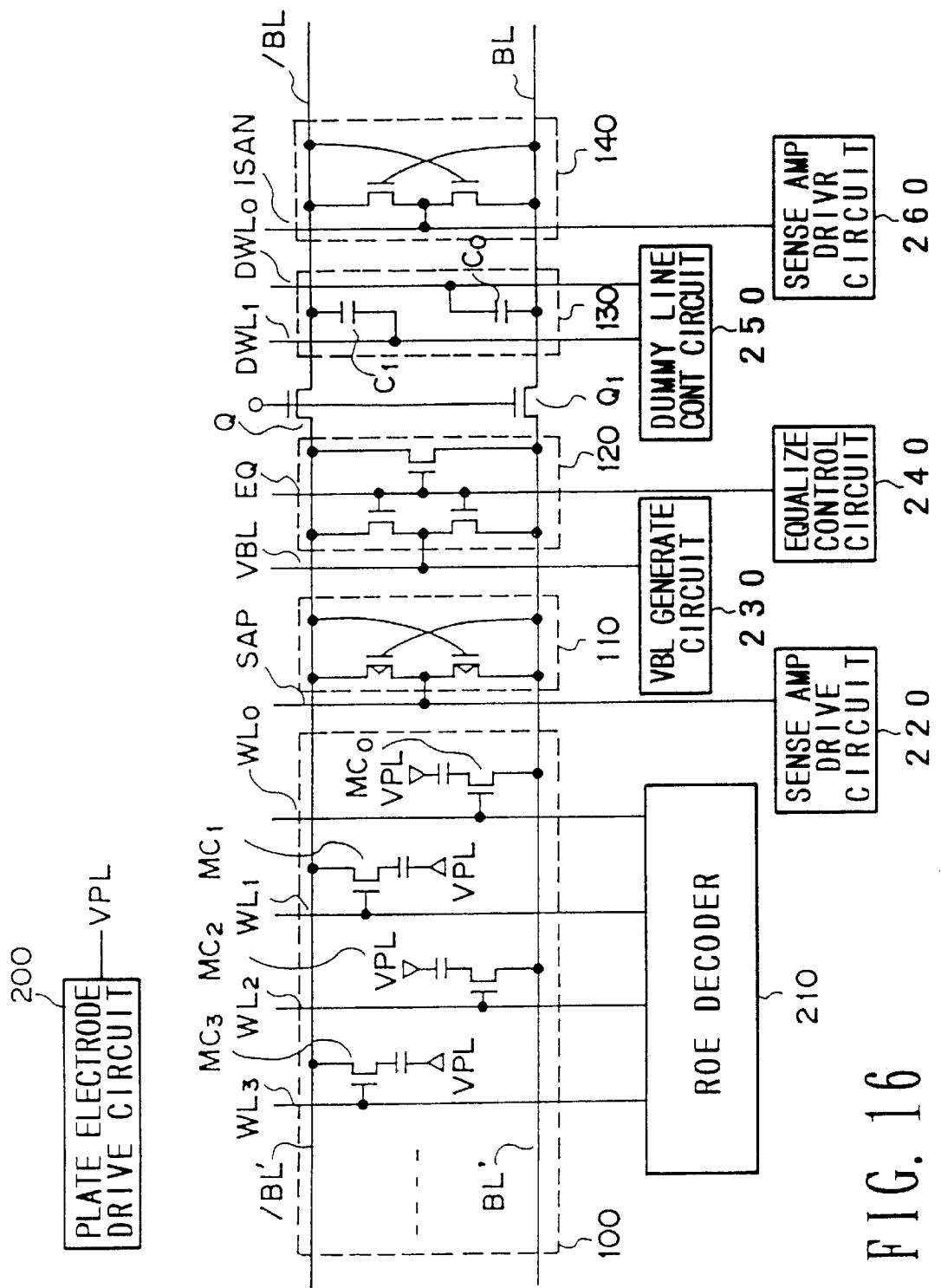
FIG. 16 is a circuit diagram showing a core section of a DRAM related to the third and fourth application examples of the present invention.

The third application will be described hereinbelow with reference to FIG. 16, which is a circuit block diagram showing a core section of a DRAM.

Bit line pairs are divided into a first region bit line pair BL' and /BL' connected to memory cells and a second region bit line pair BL and /BL connected to a sense amplifier. Between both the regions, N-channel MOS transistors Q0 and Q1 ($V_{DD}$ is applied to the gate thereof, respectively) are inserted.

As shown, DRAM cells MC composed of a transfer transistor and a capacitance are connected between the bit line pairs BL' and /BL' in zigzag fashion. The capacitances of these DRAM cells are formed between accumulation nodes of a diffusion layer formed on a semiconductor substrate and poly silicon plate electrodes opposing to the diffusion layer via an insulating film. The transfer gate transistor of each memory cell is connected to a word line WL, respectively. A memory cell array 100 can be constructed by arranging a great number of DRAM cells into a matrix pattern, as is well known.

A P-type sense amplifier 110 is connected to the bit line pair BL' and /BL'. In the sense amplifier 110, two P-channel MOS transistors are connected in series crosswise, and the common source node thereof are connected to a P-channel sense amplifier drive line SAP.

The bit line pair BL' and /BL' are connected to an equalizer circuit 120 composed of three N-channel MOS transistors (the gates are connected in common), to selectively connect the bit line pair to the bit line potential (intermediate potential) supply line VBL according to the level of the equalize signal line EQ level.

Further, a dummy capacitance section 130 is connected to the bit line pair BL and /BL. The dummy capacitance section 130 is composed of a dummy word line DWL0 connected to the bit line BL via a capacitance C0 and a dummy word line DWL1 connected to the bit line /BL via a capacitance Cl. Further, an N-type sense amplifier 140 is connected to the bit line pair BL and /BL. In the sense amplifier 140, two N-channel MOS transistors are connected in series crosswise, and the common source node thereof are connected to an N-channel sense amplifier drive line /SAN.

The bit line pairs are connected to data lines via column select gates (not shown). Data read from the memory cells via the data lines are transferred to an output buffer, and data are written from an input buffer in the memory cells via the data lines.

In addition, around the core section, there are arranged various control circuits for controlling the signal lines such as a row decoder circuit 210 for selectively driving the word lines VL, a P-channel type sense amplifier driving circuit 220 for selectively driving the sense amplifier SAP, a VBL generating circuit 230 for supplying an intermediate voltage (½. $V_{DD}$) to the VBL, an equalize control circuit 240 for controlling the equalizer circuit, a dummy word line control circuit 250 for controlling the driving of the dummy word lines DWLs, an N-channel type sense amplifier driving circuit 260 for selectively driving /SAN, etc.

Further, a plate electrode driving circuit 200 is also arranged to apply a ½ of $V_{CC}$ to two opposing electrodes of the capacitors of the memory cells.

Figure 17:
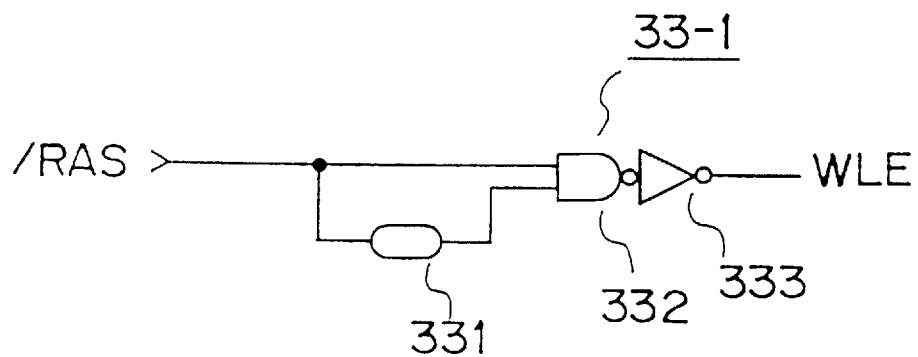
FIG. 17 is a circuit diagram showing a partial circuit construction of a row control system.

FIG. 17 is a circuit 33-1 for generating a WLE signal according to /RAS, which is composed of a delay circuit 331 for delaying a rise or fall time of /RAS by a predetermined time, a NAND gate 332, an inverter 333, etc.

Figure 18:
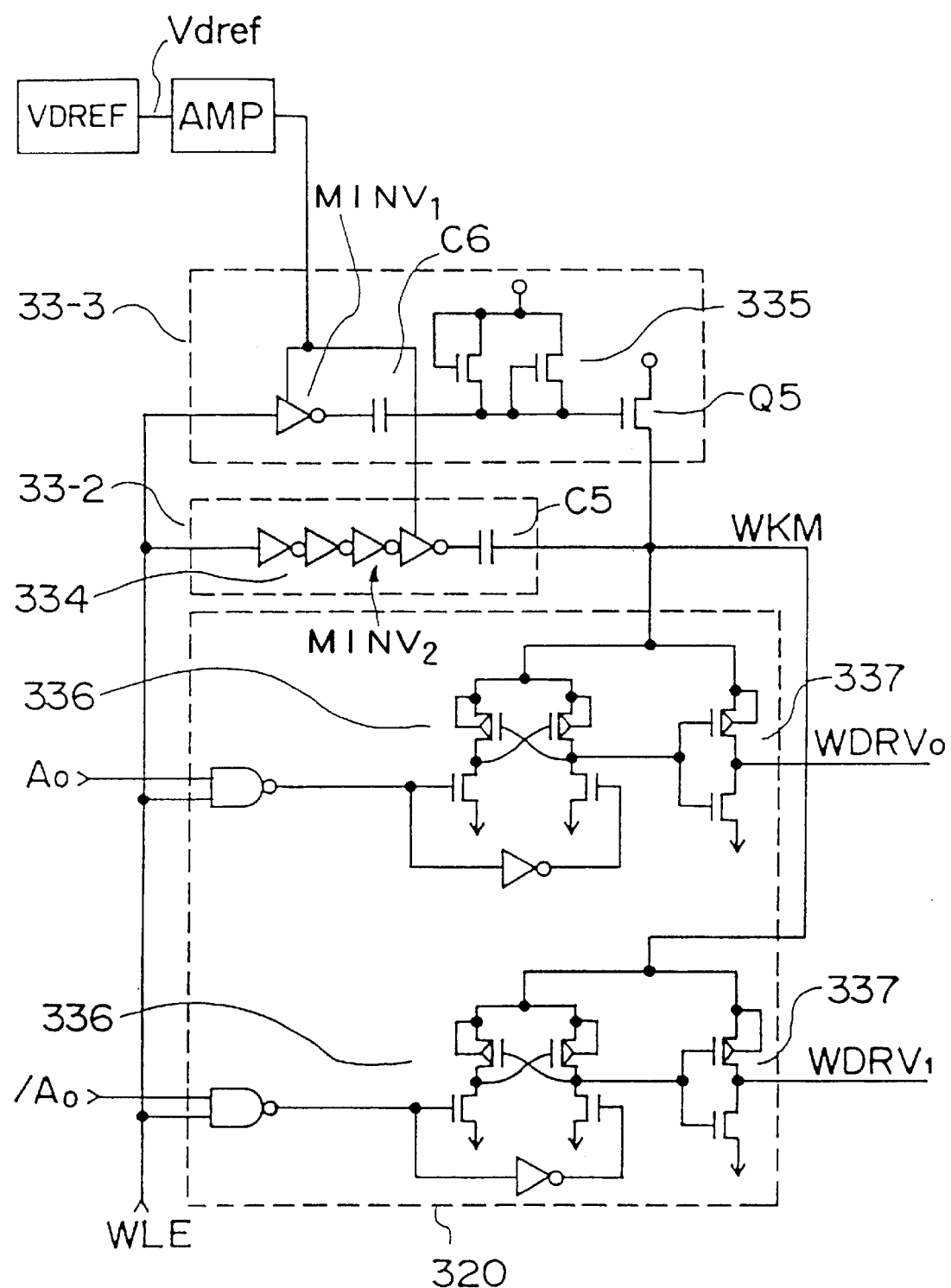
FIG. 18 is a detailed circuit diagram showing a part of the boosting circuit and a partial decoder circuit.

FIG. 18 is a detailed circuit diagram showing a boosting circuit 33-2 (a part of the boost control circuit 33), a circuit 33-3 for precharging the boost node, and a partial decoder circuit 32. The boosting circuit 33-2 is composed of an inverter chain 334 and a capacitance C5. The boost node precharging circuit 33-3 is composed of a capacitor C6, a charging circuit 335, a precharge transistor Q5, etc. The partial decoder circuit 320 for decoding addresses is composed of a level converting circuit 336 for converting the address level, a driving circuit (composed of CMOS inverter) 337 for driving the WDRV signal lines, etc.

In FIG. 18, there are arranged a reference potential generating circuit VDREF for generating a reference voltage $V_{dref}$ opposite to the supply voltage or having a gentler gradient than that of the supply voltage, and an amplifier circuit AMP as explained with reference to FIG. 1 or other. The output of the amplifier circuit AMP is used as the supply voltage of the inverter circuit MINV or MINV2. The reference potential generating circuit VDREF outputs 4V when the supply voltage is 5V, and 3V when 3V, for instance. As a result, since it is possible to suppress the level of the work line when the supply potential is high and further to reduce the stress applied to the gate oxide film, so that a DRAM of higher reliability can be realized.

Figure 19:
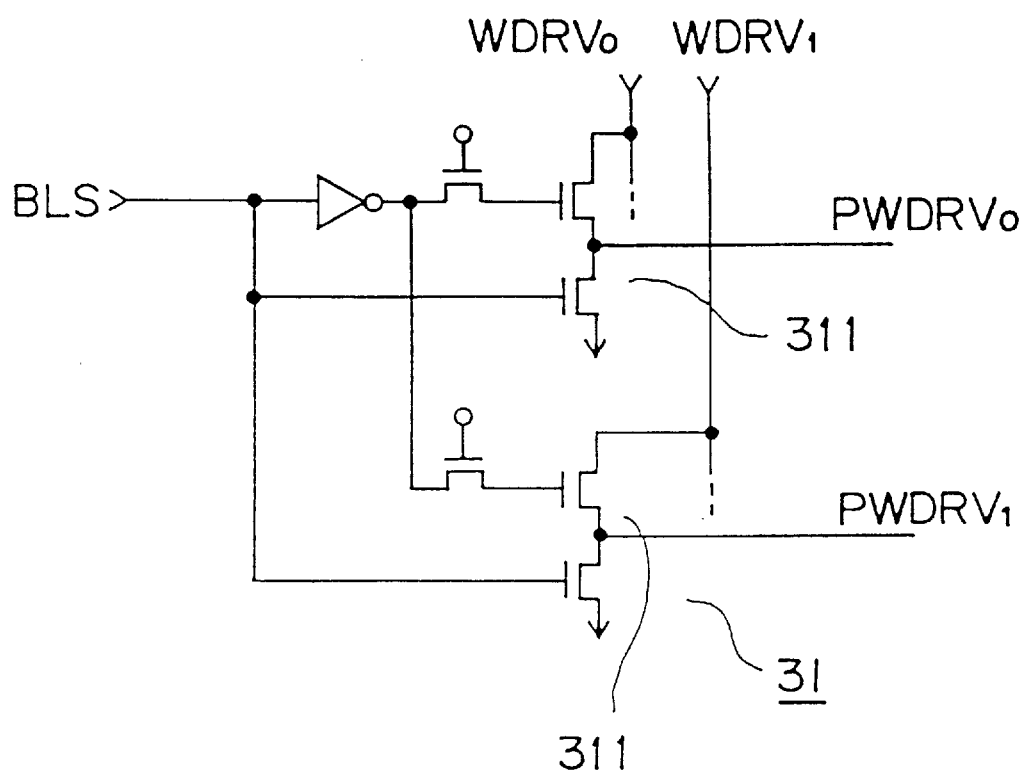
FIG. 19 is a detailed circuit showing the block selecting circuit.

FIG. 19 shows in detail a block selector circuit 31 controlled on the basis of the block select signal BLS, which is composed of a bootstrap type transfer gate for generating the PWDRV signal in response to the WDRV signal.

Figure 20:
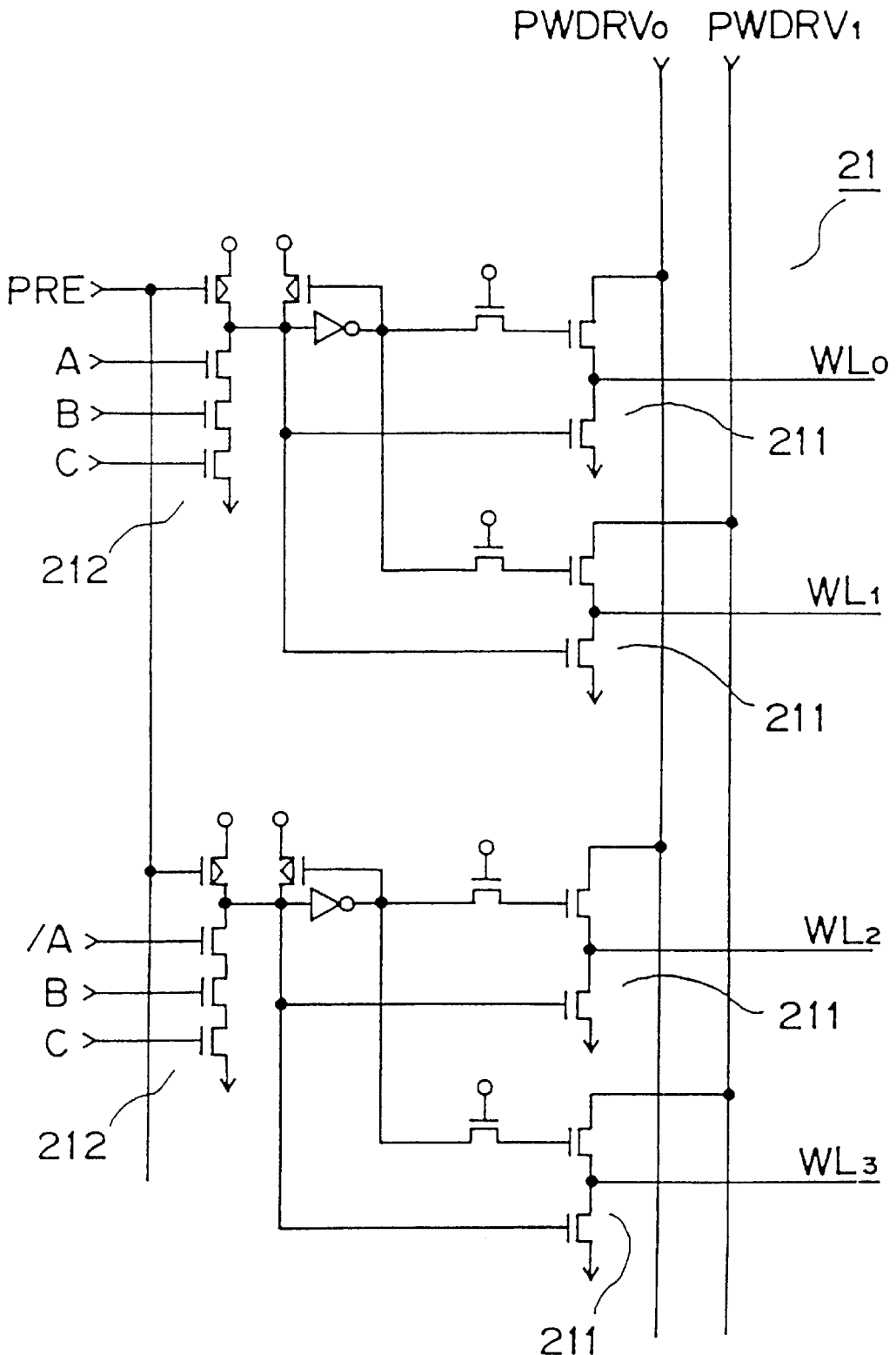
FIG. 20 is a detailed circuit diagram showing the row decoder.

FIG. 20 shows in detail a row decoder circuit 21, which is composed of a word line driving circuit 211 made up of a plurality of bootstrap type transfer gates, and a row address decoder circuit 212 controlled by address signals A, B and C, and a precharge signal PRE.

(Fourth Application)]

Figure 21:
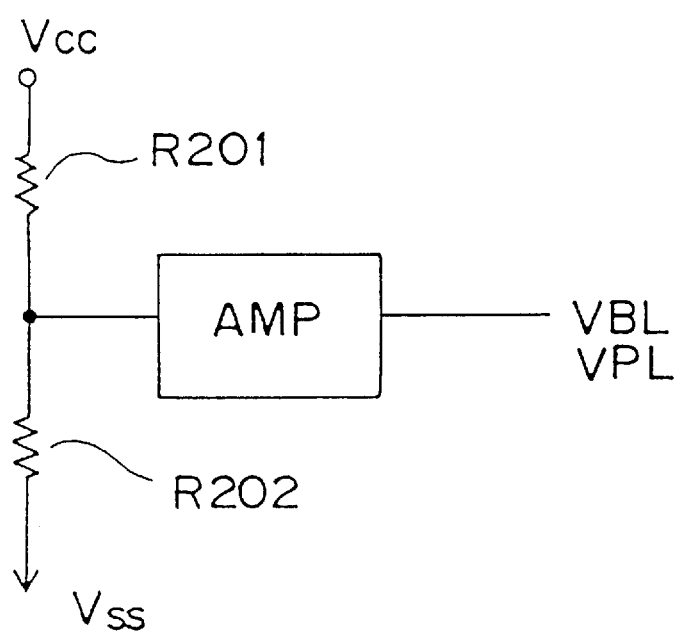
FIG. 21 is a detailed circuit diagram showing a VBL and VPL generating circuit.
Figure 22:
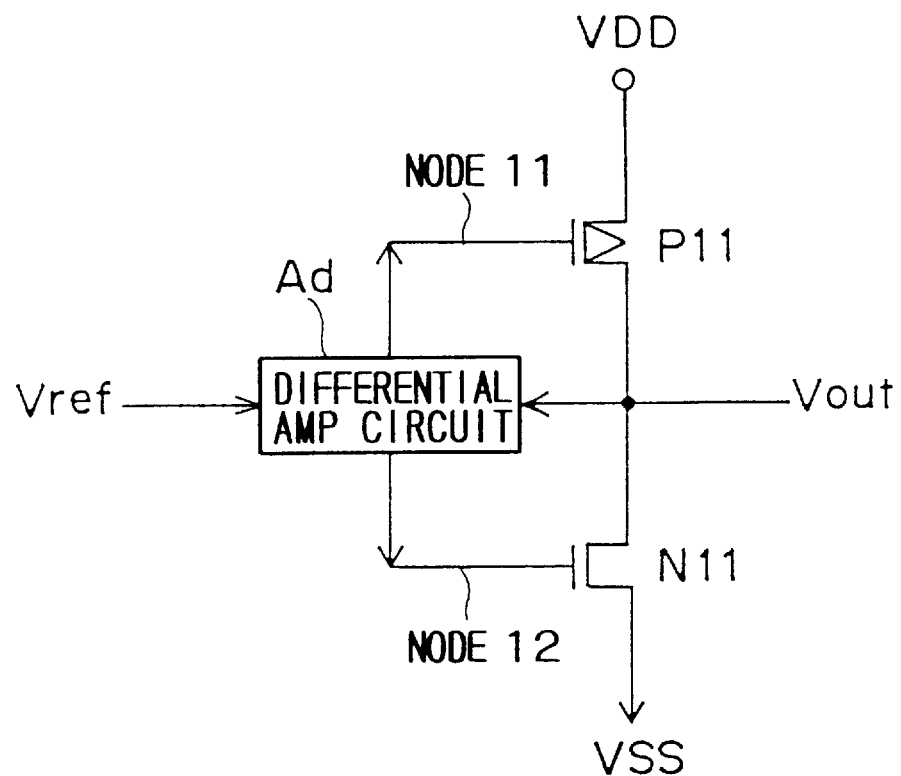
FIG. 22 is a circuit diagram showing a prior art intermediate potential generating circuit.

FIG. 21 shows a fourth application, which is related to a VPL generating circuit 200 and a VBL generating circuit 230. The fourth application is constructed by the reference potential generating circuit composed of two series connected resistance elements R201 and R202 and the amplifier circuit AMP as explained in FIG. 1.

As a result, in comparison with the prior art VPL generating circuit or VBL generating circuit, since the amplifier circuit AMP is inserted, it is possible to realize a DRAM which is stable against fluctuations in the supply voltage and in which the VBL and VPL can be restored at high speed whenever the supply voltage fluctuates.

As described above, in the constant potential generating circuit according to the present invention, it is possible to easily stabilize the output voltage, while keeping a high driving capability.

The constant potential generating circuit and the semiconductor device using the same circuit according to the present invention have been described in detail hereinabove with reference to FIGS. 1 to 21, without being limited thereto, however, it is apparent that various modifications can be made without departing the spirit of the present invention.

What is claimed is:

1. A constant potential generating circuit, comprising:
    a first output circuit for outputting an output voltage corresponding to an inputted control signal level, from a first output terminal;
    a second output circuit for outputting a comparison voltage corresponding to the inputted control signal level, from a second output terminal at a response speed higher than that of said first output circuit;
    a connecting circuit connected between the first output terminal and the second output terminal;
    a reference voltage generating circuit for independently generating a reference voltage regardless of the outputs of the first and second output circuits; and
    a comparing circuit for comparing the comparison voltage with the reference voltage, outputting the control signal on the basis of the comparison result, controlling the comparison voltage on the basis of the control signal, and further controlling the output voltage by comparing the controlled comparison voltage with the reference voltage.

2. The constant potential generating circuit of claim 1, wherein:
    said first output circuit comprises a first transistor and a second transistor both connected in series between a pair of reference supply voltages, an intermediate junction point between said first and second transistors being the first output terminal;
    said second output circuit comprises a third transistor and a fourth transistor both connected in series between a pair of the reference supply voltages, an intermediate junction point between said third and fourth transistors being the second output terminal; and
    said comparing circuit outputs a first control signal and a second control signal as the control signals and has a first control signal output terminal for outputting the first control signal and a second control signal output terminal for outputting the second control signal, the first control signal output terminal being connected to control terminals of said first and third transistors and the second control signal output terminal being connected to control terminals of said second and fourth transistors.

3. The constant potential generating circuit of claim 1, wherein said connecting circuit comprises a resistance connected in series between the first output terminal and the second output terminal.

4. The constant potential generating circuit of claim 2, wherein said connecting circuit comprises a resistance connected in series between the first output terminal and the second output terminal.

5. The constant potential generating circuit of claim 2, wherein said connecting circuit is a transistor having a control terminal connected to the first control signal output terminal.

6. The constant potential generating circuit of claim 2, wherein said connecting circuit is a transistor having a control terminal connected to the second control signal output terminal.

7. The constant potential generating circuit of claim 2, wherein said connecting circuit is formed by connecting a pair of transistors of different types in parallel to each other; a control terminal of one of the transistors is connected to the first control signal output terminal; and a control terminal of the other of the transistors is connected to the second control signal output terminal.

8. The constant potential generating circuit of claim 2, wherein said connecting circuit is a transistor; the first control signal output terminal is connected to one input terminal of a NOR circuit via an inverter; the second control signal output terminal is connected to the other input terminal of the NOR circuit; an output terminal of said NOR circuit is connected to a control terminal of said transistor.

9. The constant potential generating circuit of claim 2, wherein said connecting circuit is a transistor; the second control signal output terminal is connected to one input terminal of a NAND circuit via an inverter; the first control signal output terminal is connected to the other input terminal of the NAND circuit; and an output terminal of said NAND circuit is connected to a control terminal of said transistor.

10. The constant potential generating circuit of claim 2, wherein said connecting circuit is formed by connecting a pair of transistors of different types in parallel to each other; the first control signal output terminal is connected to one input terminal of a NOR circuit via an inverter; the second control signal output terminal is connected to the other input terminal of the NOR circuit; an output terminal of said NOR circuit is connected to a control terminal of one of said transistors; the second control signal output terminal is connected to one of the input terminals of a NAND circuit via an inverter; the first control signal output terminal is connected to the other input terminal of said NAND circuit; and an output terminal of said NAND circuit is connected to a control terminal of the other of said transistors.

11. A semiconductor device, comprising:
   first and second MOS transistors connected in series between a supply potential application node and an output node;
   a data output control circuit connected to a gate of said second MOS transistor, for driving and controlling said second MOS transistor according to output data;
   a reference potential generating circuit for outputting a reference potential changing according to the supply potential; and
   an amplifier circuit responsive to the reference potential, for driving and controlling a gate of said first MOS transistor at a potential roughly equal to the reference potential,
   wherein said amplifier includes:
      a first driving circuit having an output node connected to a gate of said first MOS transistor;
      a second driving circuit having an output node connected to an output node of said first driving circuit via a resistance element and operative at a response speed higher than that of said first driving circuit; and
      a differential amplifier circuit for comparing an output node potential of said second driving circuit with the reference potential, to control said first and second driving circuits.

12. A semiconductor device, comprising:
   first and second MOS transistors connected in series between a supply potential application node and an output node;
   a data output control circuit connected to a gate of said second MOS transistor, for driving and controlling said second MOS transistor according to output data;
   a reference potential generating circuit for outputting a reference potential changing according to the supply potential; and
   an amplifier circuit responsive to the reference potential, for driving and controlling a gate of said first MOS transistor at a potential roughly equal to the reference potential,
   said amplifier including:
      a first driving circuit having an output node connected to a gate of said first MOS transistor;
      a second driving circuit having an output node connected to an output node of said first driving circuit via a switching circuit and operative at a response speed higher than that of said first driving circuit; and
      a differential amplifier circuit for comparing an output node potential of said second driving circuit with the reference potential, to control said first and second driving circuits and the switching circuit.

13. A semiconductor device, comprising:
   a reference voltage generating circuit for generating a reference voltage changing according to a supply potential;
   a first driving circuit having an output node;
   a second driving circuit having an output node connected to the output node of said first driving circuit via a resistance element and operative at a response speed higher than that of said first driving circuit;
   a differential amplifier circuit for comparing an output node potential of said second driving circuit with the reference potential, to control said first and second driving circuits;
   a control signal generating circuit for generating a control signal according to a desired output data level;
   a first output circuit connected between an output node of said first driving circuit and said control signal generating circuit, and operative only at a low supply voltage; and
   a second output circuit connected to said control signal generating circuit, and operative irrespective of the supply voltage value.

14. A semiconductor device, comprising:
   a reference voltage generating circuit for generating a reference voltage changing according to a supply potential;
   a first driving circuit having an output node;
   a second driving circuit having an output node connected to the output node of said first driving circuit via a switching circuit and operative at a response speed higher than that of said first driving circuit;
   a differential amplifier circuit for comparing an output node potential of said second driving circuit with the reference potential, to control said first and second driving circuits and the switch circuit;
   a control signal generating circuit for generating a control signal according to a desired output data level;
   a first output circuit connected between an output node of said first driving circuit and said control signal generating circuit, and operative only at a low supply voltage; and
   a second output circuit connected to said control signal generating circuit, and operative irrespective of the supply voltage value.

15. A semiconductor device, comprising:
   a first drive circuit having an output node which outputs a first output;
   a second driving circuit having a second output node which outputs a second output connected to the first output node of said first driving circuit via a resistance element and operative at a response speed higher than that of said first driving circuit;
   a reference potential generating circuit for independently generating a reference potential regardless of the first and second outputs; and
   a differential amplifier circuit for comparing a second output node potential of said second driving circuit with the reference potential, to control said first and second driving circuits;
   the first output node of said first driving circuit being driven at roughly the same level as the reference potential.

16. A semiconductor device, comprising:
   a first driving circuit having a first output node which outputs a first output;

a second driving circuit having a second output node which outputs a second output connected to the first output node of said first driving circuit via a switching circuit and operative at a response speed higher than that of said first driving circuit;

a reference potential generating circuit for independently generating a reference potential regardless of the first and second outputs; and a differential amplifier circuit for comparing a second output node potential of said second driving circuit with the reference potential, to control said first and second driving circuits the switching circuit;

the first output node of said first driving circuit being driven at roughly the same level as the reference potential.

17. A semiconductor device, comprising:

a first P-channel MOS transistor connected between a first voltage supply terminal and an output terminal;

a first N-channel MOS transistor connected between a second voltage supply terminal and the output terminal;

a second P-channel MOS transistor connected between the first voltage supply terminal and a comparison terminal;

a second N-channel MOS transistor connected between the second voltage supply terminal and the comparison terminal;

a resistance element connected between the output terminal and the comparison terminal;

a reference potential generating circuit for generating a reference potential;

a comparing circuit for comparing the reference potential with a potential at the comparison terminal and outputting a comparison result;

a first buffer circuit responsive to the comparison result, for driving both said first P-channel MOS transistor and said second P-channel MOS transistor; and a second buffer circuit responsive to the comparison result, for driving both said first N-channel MOS transistor and said second N-channel MOS transistor, a threshold of said second buffer circuit being different from that of said first buffer circuit.

18. A semiconductor device, comprising:

a first P-channel MOS transistor connected between a first voltage supply terminal and an output terminal;

a first N-channel MOS transistor connected between a second voltage supply terminal and the output terminal;

a second P-channel MOS transistor connected between the first voltage supply terminal and a comparison terminal;

a second N-channel MOS transistor connected between the second voltage supply terminal and the comparison terminal;

a reference potential generating circuit for generating a reference potential;

a comparing circuit for comparing the reference potential with a potential at the comparison terminal and outputting a comparison result;

a first buffer circuit responsive to the comparison result, for driving both said first P-channel MOS transistor and said second P-channel MOS transistor;

a second buffer circuit responsive to the comparison result, for driving both said first N-channel MOS transistor and said second N-channel MOS transistor, a threshold of said second buffer circuit being different from that of said first buffer circuit; and a switching element connected between the output terminal and the comparison terminal and controlled on the basis of the comparison result.

19. The semiconductor device of claim 17, wherein, the first buffer circuit includes a 1st inverter $INV_1$ with a threshold voltage of $V_{th}(IVN_1)$ and the second buffer circuit includes a 2nd inverter $INV_2$ with a threshold voltage of $V_{th}(IVN_2)$ and wherein the following equation is satisfied:

$$V_{th}(INV_1) > V_{th}(INV_2).$$

20. The semiconductor device of claim 18, wherein, the first buffer circuit includes a 1st inverter $INV_1$ with a threshold voltage of $V_{th}(INV_1)$ and the second buffer circuit includes a 2nd inverter $INV_2$ with a threshold voltage of $V_{th}(INV_2)$ and wherein the following equation is satisfied:

$$V_{th}(INV_1) > V_{th}(INV_2).$$

21. A semiconductor device, comprising:

a first P-channel MOS transistor connected between a first voltage supply terminal and an output terminal;

a first N-channel MOS transistor connected between a second voltage supply terminal and the output terminal;

a reference potential generating circuit for generating a reference potential;

a comparing circuit having a comparison terminal and an output terminal for comparing the reference potential with a potential at the comparison terminal and outputting a comparison result at the output terminal;

a first buffer circuit including a 1st inverter $INV_1$ having the threshold voltage of $V_{th}(INV_1)$, responsive to the comparison result, for driving said first P-channel MOS transistor; and a second buffer circuit including a 2nd inverter $INV_2$ having the threshold voltage of $V_{th}(INV_2)$, responsive to the comparison result, for driving said first N-channel MOS transistor, wherein the following equation is satisfied:

$$V_{th}(INV_1) > V_{th}(INV_2).$$

* * * * *